(12) United States Patent
Kaneda et al.

(10) Patent No.: US 6,444,379 B1
(45) Date of Patent: Sep. 3, 2002

(54) METHOD AND APPARATUS FOR MANUFACTURING PRINTED WIRING BOARD

(75) Inventors: Yasuo Kaneda; Masanori Takase; Kenji Hyodo, all of Tokyo (JP)

(73) Assignee: Mitsubishi Paper Mills Limited, Tokyo (JP)

( * ) Notice: Subject to any disclaimer, the term of this patent is extended or adjusted under 35 U.S.C. 154(b) by 0 days.

(21) Appl. No.: 09/445,147

(22) PCT Filed: Apr. 22, 1998

(86) PCT No.: PCT/JP98/01848

§ 371 (c)(1),
(2), (4) Date: Dec. 3, 1999

(87) PCT Pub. No.: WO99/52335

PCT Pub. Date: Oct. 14, 1999

(30) Foreign Application Priority Data

Apr. 6, 1998 (JP) .............................................. 10-93311

(51) Int. Cl.[7] ......................... G03G 13/04; G03G 15/16; G03G 5/06
(52) U.S. Cl. ........................... 430/22; 430/54; 430/103; 430/131; 355/259; 347/238; 399/402; 399/31
(58) Field of Search ..................... 430/22–54, 103–131; 355/259; 347/238; 399/402, 31

(56) References Cited

U.S. PATENT DOCUMENTS

| | | | | |
|---|---|---|---|---|
| 5,049,942 A | * | 9/1991 | Bujese | 355/272 |
| 5,494,764 A | * | 2/1996 | Hyodo | 430/31 |
| 5,811,212 A | * | 9/1998 | Tanaka | 430/58 |

FOREIGN PATENT DOCUMENTS

| | | |
|---|---|---|
| JP | 06112627 A | 4/1994 |
| JP | 06-112627 | 4/1994 |
| JP | 06224541 A | 8/1994 |
| JP | 06-224541 | 8/1994 |
| JP | 06-237065 | 8/1994 |
| JP | 06237065 A | 8/1994 |
| JP | 07-66528 | 3/1995 |
| JP | 07066528 A | 3/1995 |
| JP | 07-170052 | 7/1995 |
| JP | 07170052 A | 7/1995 |
| JP | 07245261 A | 9/1995 |
| JP | 07-245261 | 9/1995 |
| JP | 07245461 A | 9/1995 |
| JP | 07263839 A | 10/1995 |
| JP | 07-263839 | 10/1995 |
| JP | 08-32232 | 2/1996 |
| JP | 08-46330 | 2/1996 |
| JP | 08032232 A | 2/1996 |
| JP | 08046330 A | 2/1996 |
| JP | 08211639 A | 8/1996 |
| JP | 08-211639 | 8/1996 |

* cited by examiner

Primary Examiner—Mark F. Huff
Assistant Examiner—Daborah Chacko-Davis
(74) Attorney, Agent, or Firm—Paul E. White, Jr.; Manelli Denison & Selter PLLC

(57) ABSTRACT

There are provided a method for preparing a printed wiring board which can form electrostatic latent images at the desired positions of a substrate with good precision, and a uniform and good image can be formed for preparing a printed wiring board having circuits on the both surfaces of the substrate from a material to be developed having at least a metal conductive layer and a photoconductive layer on both surfaces of an insulating substrate in this order, and a preparation device.

13 Claims, 4 Drawing Sheets

METHOD AND APPARATUS FOR MANUFACTURING PRINTED WIRING BOARD

This application is the national phase of international application PCT/JP98/01848 filed Apr. 22, 1998 which designated the U.S.

TECHNICAL FIELD

This invention relates to a process for making a printed wiring board which comprises preparing a printed wiring board utilizing an electrophotographic method using a material to be developed having a metal conductive layer and a photoconductive layer in this order on at least one surface of an insulating substrate and a preparation device thereof.

BACKGROUND ART

A method for making a printed wiring board is roughly classified into two methods of the subtractive method and the additive method. The subtractive method is a method of forming a resist layer on a laminated board to which a conductive layer such as copper, etc. is provided on an insulating substrate, and removing the conductive layer not covered by the resist layer by etching. The additive method is a method of forming a conductive layer only at a wiring pattern portion on an insulating substrate. In addition the above, it has been proposed a wiring transfer method in which a resist image is provided by a plate resist on a conductive substrate, metal plating is applied to the conductive substrate other than the resist image to form a metal wiring pattern, and then, the resist image is removed, only the metal wiring pattern is transferred to the insulating material.

Moreover, according to the recent trend of making light, thin, short and compact, or variety of electronic devices, in a printed wiring board, it is required to make it with high density and within a short period of time. Also, application of an electrophotographic material as a resist material has been investigated. Heretofore, in an electrophotographic material to be used in an electronic photography lithographic printing plate, etc., drawing an image at an infrared region has been already carried out, and it has been practically carried out that an image data are directly sent from a computer by a scanning exposure of a laser beam without using a photomask to form an image with a high density.

Also, not only the above-mentioned scanning exposure, but also a light-sensitive electrophotographic printing material is high sensitivity in a surface exposure using a photomask, so that it is not necessary to use the conventionally used expensive ultra-high pressure or high-pressure mercury lamp for printing a resist or an expensive UV exposure device such as a metal halide lamp, etc., and there is a merit of capable of using a simple and easy, and cheap visible light exposure device.

Also, in a photopolymer which is the conventional resist, an exposed portion of a photopolymer layer provided with a certain film thickness is cured or solubilized to form a wiring pattern. However, in this case, if light to be irradiated through a photomask is scattered light, light is spread in the photopolymer-layer, and in this case, a line width of an origin of the photomask cannot be reproduced accurately. Also, when dry resist film is used, resolution becomes worse due to spread of light still more in a scattered light since a polyester film exists between the photomask and the resist. This phenomenon becomes more significant when a wiring pattern becomes finer, and thus, light to be irradiated is required to be parallel light. As an exposure device therefor, there are a device in which light is tried to be parallel light by elongating the distance between a light source and an exposure surface, or a device in which a parabolic mirror is provided at the back surface of a light source and a light buffle is provided at an exposure surface side of the light source so that only the parallel light reflected from the back surface is irradiated to the exposure surface or the like. In either of the method, not only the device becomes complicated and a large-sized, but also utilization factor of light is lowered. On the other hand, as is clear from the explanation mentioned below, in the resist using the electrophotographic method, presence or absence of electric charge on the surface of a photoconductive layer contributes to resolution so that it is not so required to consider lowering in resolution by spreading light in the photoconductive layer. Accordingly, as an exposure device, that using a scattered light can be used and there is a merit of constituting an inexpensive and a small sized exposure system.

In the preparation method of a resist layer utilizing an electrophotographic method, a photoconductive layer is provided on a metal conductive layer of an insulating substrate on which a metal conductive layer is provided on the insulating substrate, and after uniformly charging the surface of the photoconductive layer in a dark place, an electrostatic latent image corresponding to a wiring pattern is formed by exposure. The electrostatic latent image is subjected to toner developing treatment and fixing, and by using the toner image as a resist, the photoconductive layer of the toner image unformed portion is dissolved and removed to prepare a resist image of a metal conductive layer comprising the toner image and the photoconductive layer. Dissolution and removal of the unnecessary portion of the metal conductive layer and the subsequent preparation step of the printed wiring board can be carried out in the same manner as in the conventional procedure.

A method of toner developing treatment can be roughly classified to a positive development method using a toner having a charge in an opposite polarity to an electrostatic latent image by exposing a non-image portion, and a reverse development method using a toner having a charge with the same polarity as that of an electrostatic latent image by exposing an image portion.

The preparation method of a printed wiring board by the electrophotographic method using the positive development method has been proposed in Japanese Patent Publication No. 35518/1989, and the preparation method of a printed wiring board by the electrophotographic method using the reverse development method has been proposed in Japanese Provisional Patent Publication No. 112627/1994.

At present, in a progress of high density preparation of a printed wiring board, a printed wiring board having a lot of conductive fine pores-called through holes provided to respective substrate with a multi-layered structure has been prepared. In this case, circuits formed on the both surfaces of the substrate are connected by the through holes. Thus, not only precision of the circuit itself formed on the substrate but also precision of formed positions of the circuits on the both surfaces relative to the through holes as a standard, i.e., positional precision prior to formation of the resist film are required.

Also, at the time of forming a wiring pattern, it is important to completely protect the metal conductive layer in the through hole by using a resist. That is, in the electrophotographic method, in the toner developing treatment step, it is necessary to form a toner image throughout the whole surfaces in the through holes.

When the electrophotographic method by the reverse developing method is used, procedure is carried out that the surface of a photoconductive layer is charged in a dark place and forming an electrostatic latent image is formed by vanishing a charge at the exposed portion by exposing an image portion, and then, fine toner particles having the same polarity as those of the charged electric charge are adhered to the exposed portion, i.e., to a portion at which the electric charge is vanished. At this time, a conductive member called a developing electrode is provided opposed to the surface of an electrostatic latent image, and a bias voltage with the same polarity is applied to the electrode whereby adhesion of the toner particles to the exposed portion is promoted and a toner image with a high image quality can be obtained.

A toner attached amount at the toner developing treatment is markedly dependent on a toner concentration, a developing time as well as the state of an electric field at around the exposed portion of a material to be developed. That is, as the electric field is stronger, adhesion of the toner can be carried out rapidly, and accordingly, the toner attached amount with a limited developing time becomes much.

The state of an electric field is regulated by the constitution of a developing electrode, positional relationship with a substrate, a bias voltage applied to the developing electrode and a surface potential of a substrate electrostatic latent image, etc. The electric field inside of the through hole becomes markedly weak as compared with the electric field at the surface of the substrate since the distance from the developing electrode and the distance of an unexposed portion of the substrate surface. Thus, a rate of toner attachment in the through hole becomes late as compared with the substrate surface, and as a result, the toner attached amount becomes a little. This tendency becomes particularly remarkable when a ratio of a substrate thickness and a diameter of the through hole, i.e., an aspect ratio of the through hole becomes high.

It is possible to increase an amount of the attached toner in the through hole by elongating the development time or thickening a toner density. However, it causes at the same time that the toner-attached amount to the wiring image at the both surfaces of the substrate is unduly increased. In a fine wiring pattern, due to excessive attachment of the toner, toner images of wiring adjacent to each other are fused, and as a result, to cause shortage between wiring. Accordingly, in order to prepare a printed wiring board having through holes in a good state, it must be increased an attached amount of the toner in the through holes without lowering resolution of a wiring image on the substrate surface.

If a sufficient amount of toner-attachment cannot be carried out in a through hole with a high aspect ratio, a part of the metal conductive layer in the through hole is removed by failure of the resist of the toner image at the time of removal of the photoconductive layer after toner developing treatment and subsequent removal of the metal conductive layer. In such a case, open circuit at the both surfaces of the substrate occurs or, even when there is an open circuit, there is a possibility of causing failure due to fatigue of an incompletely covered metal conductive layer in the through hole by heat applied to at the time of soldering, by various used circumstances of the substrate, by a heat cycle applied thereto during transportation, or by heating and cooling at repeated uses. This finally causes a problem of occurring breakage of the metal conductive layer, i.e., open circuit.

A method of preparing a resist layer to the both surfaces of a substrate utilizing the electrophotographic method has been disclosed in Japanese Provisional Patent Publication No. 224541/1994, and it is possible to form toner images on the both surfaces by simultaneously developing both surfaces of a laminated board in which a metal conductive layer and a photoconductive layer are provided on the both surfaces of an insulating substrate. Accordingly, it is sufficient to form an electrostatic latent image corresponding to a desired wiring pattern on at least both surfaces of the photoconductive layers. However, when a printed wiring board having a through hole is prepared by the electrophotographic method, as in the case where it is prepared by the method other than the electrophotographic method, it is required not only to protect the metal conductive layer in the through hole by a resist as a matter of course, but also to ensure precision of circuits provided on both surfaces or precision of their formed positions as well as a positional relationship of an electrostatic latent image itself and a static charge potential necessary at the said position.

An object of the present invention is to prepare a printed wiring board by utilizing the electrophotographic method. That is, for preparing not only a material to be developed having a metal conductive layer and a photoconductive layer on one surface of an insulating substrate, but also a printed wiring board having circuits on the both surfaces of a substrate from a material to be developed having at least a metal conductive layer and a photoconductive layer on the both surfaces of an insulating substrate, it is a technical task to provide a process for making a printed wiring board which can particularly ensure a positional relationship of an electrostatic latent image itself and a static charge potential necessary at the said position, is capable of forming a uniform and good image without any stain at the both surfaces, and when there are through holes, resist can be completely carried out by attachment of a toner at the inside of the through hole, open circuit is never caused and stable through holes having durability can be formed, and to provide a preparation device of the same.

DISCLOSURE OF THE INVENTION

A method for preparing a printed wiring board of the present invention comprises placing a material to be developed having at least a metal conductive layer and a photoconductive layer on both surfaces of an insulating substrate in this order on a platen to apply thereto alignment and static charge, then exposing one of the photoconductive layer of the material to be developed to provide an electrostatic latent image, reversing the material to be developed to apply thereto alignment and static charge again, exposing the photoconductive layer surface which is the opposite surface of the electrostatic latent image-formed surface of the material to be developed to form an electrostatic latent image, and subjecting to toner developing treatment.

Also, a method for preparing a printed wiring board of the present invention comprises statically charging photoconductive layers at the both surfaces of a material to be developed having at least a metal conductive layer and a photoconductive layer on both surfaces of an insulating substrate in this order, subjecting to alignment to a predetermined position, exposing the material to provide an electrostatic latent image on one photoconductive layer surface of the material to be developed, reversing said material to be developed to apply thereto alignment to a predetermined position, exposing the photoconductive layer surface which is the opposite surface of the electrostatic latent image-formed surface of the material to be developed to form an electrostatic latent image, and subjecting to toner developing treatment.

Also, a method for preparing a printed wiring board of the present invention comprises statically charging photoconductive layers at the both surfaces of a material to be developed having at least a metal conductive layer and a photoconductive layer on both surfaces of an insulating substrate in this order, exposing the material to provide an electrostatic latent image on one photoconductive layer surface of the material to be developed, subjecting to toner developing treatment to form a toner image, statically charging again both surfaces of the material to be developed, exposing the photoconductive layer surface which is the opposite surface of the toner image-formed surface of the material to be developed to form an electrostatic latent image, and subjecting to toner developing treatment.

Also, a method for preparing a printed wiring board of the present invention comprises providing development electrodes which can apply voltages between the above-mentioned metal conductive layers on the both surfaces of the substrate opposed to each other at the both sides of the substrate, statically charging photoconductive layers at the both surfaces of the above-mentioned material to be developed, exposing the material to be developed to form an electrostatic latent image on one of the photoconductive layer surfaces, and subjecting to toner developing treatment of the material to be developed by setting a bias voltage of the electrode which is so provided as opposing to the surface of the photoconductive layer on which no electrostatic latent image is formed to substantially 0 V, whereby good toner image can be formed and preparation of good printed wiring board can be accomplished.

Also, a method for preparing a printed wiring board of the present invention comprises statically charging photoconductive layers at the both surfaces of a material to be developed having at least a metal conductive layer and a photoconductive layer on both surfaces of an insulating substrate in this order, exposing the material to provide electrostatic latent images on the photoconductive layer surfaces at the both surfaces of the material to be developed, and subjecting to toner developing treatment by development electrodes at the respective surface to which at least two different bias voltages can be applied, respectively, to form a toner image.

Also, the above-mentioned material to be developed is not only a material having the constitution that at least a metal conductive layer and a photoconductive layer on both surfaces of an insulating substrate in this order, but also a material prepared by making a through hole(s) to a laminated board in which first metal conductive layers are provided on the both surfaces of an insulating substrate, subjecting to metal plating treatment of the laminated board to provide second metal conductive layers at the inside of the through hole(s) and on the surface of the laminated board, and then, forming photoconductive layers on the second metal conductive layers. By employing the latter material, required statically charging potential can be ensured, and uniform and good image can be formed on the both surfaces without any stain, resist with attachment of a toner at the inside of the through hole(s) can be completely carried out, whereby preparation of a printed wiring board which does not causes open circuit and is capable of forming durable and stable through hole(s) can be accomplished.

Also, the printed wiring board according to the method as mentioned above can be prepared by a preparation device which comprises a platen on which a material to be developed having a metal conductive layer and a photoconductive layer on at least one surface of an insulating substrate in this order is to be placed thereon, a supplying means of the material to be developed for placing the material to be developed on the platen, a statically charging means for statically charging at least the surface at which the photoconductive layer is provided of the material to be developed, a registration means for subjecting the material to be developed on the platen to alignment at a predetermined position, an exposure means for forming an electrostatic latent image on the statically charged photoconductive layer surface, and a reversing means of the material to be developed which is capable of reversing the material to be developed at least one surface of which is formed a static charge latent image.

Also, a preparation device of the printed wiring board according to the present invention comprises a platen on which a material to be developed having at least a metal conductive layer and a photoconductive layer on both surfaces of an insulating substrate in this order is to be placed thereon, a supplying means of the material to be developed for placing the material to be developed on the platen, a statically charging means for statically charging the photoconductive layers on the both surfaces of the material to be developed, a registration means for subjecting the material to be developed on the platen to alignment at a predetermined position, an exposure means for forming an electrostatic latent image on the statically charged photoconductive layer surface, and a reversing means of the material to be developed which is capable of reversing the material to be developed at least one surface of which is formed a static charge latent image.

Also, in the above-mentioned preparation devices of the printed wiring board, by having a grounding means which contacts with a side surface of the material to be developed placed on the platen, stable static charging can be carried out and static charging without disturbing uniform charged state on the both surfaces of the material to be developed can be carried out.

Also, in the above-mentioned preparation devices of the printed wiring board, if the statically charging means is a roll statically charging means, a material to be developed which has a metal conductive layer and a photoconductive layer in this order on the both surfaces of an insulating substrate which is a material to be statically charged can be conveyed and the both surfaces can be simultaneously statically charged.

Also, even when the material to be developed has the above-mentioned through hole(s), a printed wiring board in which toner is thoroughly adhered to the inside of the through hole(s) without causing breakage of a wire can be produced when a toner image is formed by the reverse development method under a suitable bias voltage application without generating unnecessary static charge in the through hole(s).

Also, in the above-mentioned preparation devices of the printed wiring board, if the device has a surface potential measuring means for measuring the surface potential of the material to be developed which is statically charged, inconvenience of the photoconductive layer of the material to be developed or a statically charging means can be known by measuring the surface potential of the material to be developed which is statically charged.

Also, the statically charged material to be developed is transferred under the surface potential measuring means, positional relationship between the surface potential measuring means and the statically charged material to be developed can be judged by the measured potential.

Also, in the preparation method of the above-mentioned printed wiring board, by measuring the surface potential of the statically charged surface, alignment of the statically charged material to be developed can be carried out without contacting them from the changed state of the measured potentials by the positional relationship between the surface potential measuring means and the statically charged material to be developed.

Also, in the preparation method of the above-mentioned printed wiring board, if the material to be developed has a through hole(s) as mentioned above, potential difference can be confirmed when the through hole(s) portion is passed under the surface potential measuring means so that highly precision alignment of the statically charged material to be developed can be realized by measuring the surface potentials at the through holes and near to the same and based on the positional relationships between the group of through holes.

Also, by making the above-mentioned exposure method a scanning exposure system using a light emitting diode array, the data from a computer can be directly used for exposure whereby the process can be simplified. And yet, it uses a light emitting diode array so that a complex optical system such as a polygon mirror or a fθ lens is not used whereby preparation of a printed wiring board can be carried out with cheap, simple and easy optical system adjustment and with good precision.

BEST MODE FOR CARRYING OUT THE INVENTION

Figure 1:
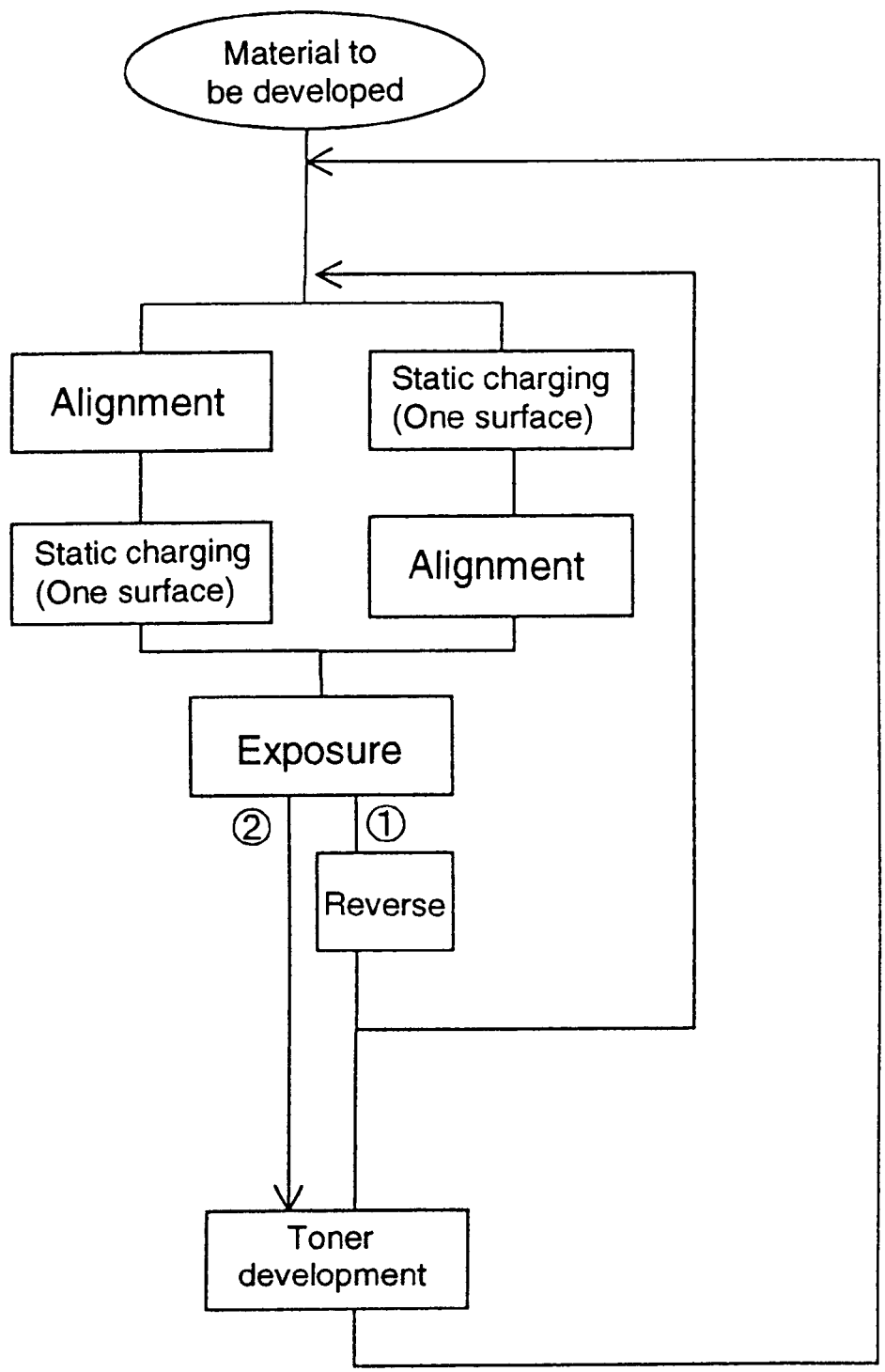
FIG. 1 is a process explanation drawing of the preparation device of a printed wiring board of claim 7 to be used for realizing the preparation method of a printed wiring board of claim 1 according to the present invention.
Figure 2:
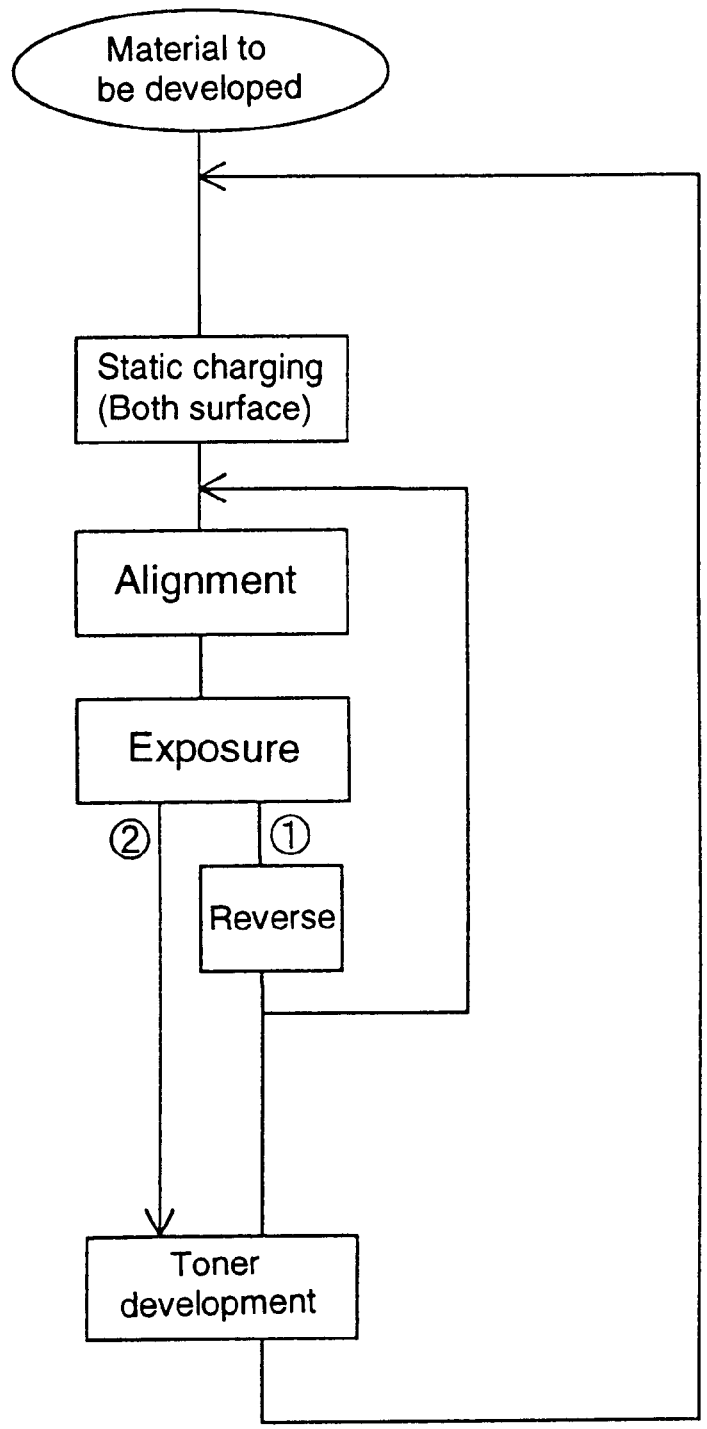
FIG. 2 is a process explanation drawing of the preparation device of a printed wiring board of claim 8 to be used for realizing the preparation method of a printed wiring board of claim 2 according to the present invention.

In the following, the method for preparing a printed wiring board and a preparation device of the present invention are explained in detail. To the preparation device of a printed wiring board of the present invention can be basically applied the method for preparing a printed wiring board of the present invention, and the method for preparing a printed wiring board of the present invention can be advantageously carried out by using the preparation device of a printed wiring board of the present invention. Accordingly, in the following, while explaining the preparation device of a printed wiring board of the present invention, the method for preparing a printed wiring board of the present invention is explained.

The preparation device of a printed wiring board of the present invention is basically a device for preparing a printed wiring board by utilizing an electrophotographic method. This device takes at least until formation of a toner image corresponding to a wiring pattern to the both surfaces of a material to be developed among the steps of preparing a printed wiring board having circuits on the both surfaces of a substrate from the material to be developed having at least a metal conductive layer and a photoconductive layer in this order on the both surfaces of an insulating substrate.

The toner image formed on the material to be developed is used as a resist and the photoconductive layer at which the toner image is not formed is dissolved and removed, a resist image of the metal conductive layer comprising the toner image and the photoconductive layer is prepared. Dissolution and removal of the unnecessary portion of the metal conductive layer and the subsequent preparation process of the printed wiring board can be carried out in the same manner as in the conventional process to prepare a printed wiring board.

The preparation process in the preparation device of a printed wiring board of the present invention comprises placing a material to be developed on a platen by a supplying means of the material to be developed, subjecting to alignment on the platen by a registering means and static charging of a photoconductive layer at the reverse side of an opposed surface of the platen by a statically charging means whereby forming an electrostatic latent image at the statically charged surface by an exposure means, and then, reversing the material to be developed in which an electrostatic latent image is formed on at least one surface thereof by a reversing means of the material to be developed to apply thereto alignment and static charge again, and exposing the photoconductive layer surface which is present at the opposite surface of the electrostatic latent image-formed surface of the material to be developed to form an electrostatic latent image. When the resulting material is subjected to toner developing treatment, toner images corresponding to the wiring patterns are formed on the both surfaces of the material to be developed.

Also, photoconductive layers at the both surfaces of the material to be developed are statically charged during placing the material to be developed on a platen according to the supplying means of a material to be developed and a statically charging means, the material is subjected to alignment on the platen by a registering means, and an electrostatic latent image is formed at the statically charged surface which is a reverse side of opposing to the platen by an exposing means, then, the material to be developed at which the electrostatic latent image is formed on at least one surface thereof is reversed by a reversing means of the material to be developed and subjected to alignment, and the photoconductive layer surface which is the opposite surface of the electrostatic latent image-formed surface of the material to be developed is exposed to form an electrostatic latent image. When the resulting material is subjected to toner developing treatment, toner images corresponding to the wiring patterns are also formed on the both surfaces of the material to be developed.

Accordingly, preparation of the printed wiring board according to the present invention contains at least the respective steps of a material to be developed-supplying step in which the material to be developed is placed on a platen, a registering step in which the material to be developed on the platen is subjected to alignment at the predetermined position, an exposure step in which an electrostatic latent image is formed on a statically charged surface, and a material to be developed-reversing step in which the material to be developed is reversed.

So long as employing the method in which a toner image is formed on a desired and predetermined position of the photoconductive layer surface of the material to be developed by utilizing the electrophotographic method, prior to formation of an image to the material to be developed, the material to be developed must be supplied to the place at which an image is to be formed, and the material to be developed must be statically charged at least before forming an electrostatic latent image by exposure and subjected to alignment at the predetermined position.

On the other hand, with regard to simultaneous formation of electrostatic latent images to the photoconductive layers on the both surfaces of the material to be developed, it is possible to carry out exposure by the conventional method using photomasks. However, as an exposure means, when the images are to be formed substantially at the same time on the both surfaces of the material to be developed by using at least scanning exposure with laser beam to directly send image data from a computer, not only scanning exposure mechanisms become complex but also it is extremely difficult to form high quality images at the predetermined position. Thus, in the present invention, at least both surfaces simultaneous scanning exposure is not used. Thus, irrespective of the both surface simultaneous static charging or the stepwise static charging, formation of an electrostatic latent image at an opposite surface to the other surface to which an electrostatic latent image had been already formed, and alignment prior thereto are carried out after the reversing step of the material to be developed in which the material to be developed is reversed.

Accordingly, the order of the above-mentioned procedure in the preparation of the printed wiring board according to the present invention comprises, in the preparation process containing stepwise charging in which static charging is carried out one surface and then the other surface (hereinafter referred to as the stepwise static charging method), a material to be developed-supplying step, a registering step and a statically charging step subsequent thereto or a statically charging step and a registering step subsequent thereto, an exposure step (hereinbefore a first step), and via a material to be developed-reversing step, a registering step and a statically charging step subsequent thereto or a statically charging step and a registering step subsequent thereto, and an exposure step (hereinbefore a second step) in this order. Then, a toner developing treatment step of electrostatic latent images at the both surfaces is carried out.

Also, in the preparation step including the both surface simultaneously statically charging (hereinafter referred to as the both surface simultaneously statically charging method), it is the other of a material to be developed-supplying step, a statically charging step, a registering step, and an exposure step (hereinbefore a first step), a material to be developed-reversing step, a registering step and an exposure step (hereinbefore a second step). Thereafter, a toner developing treatment step of electrostatic latent images at the both surfaces is carried out.

Also, between the first step and the second step of the stepwise static charging method and the both surface simultaneously statically charging method, a toner developing treatment step of one surface of the electrostatic latent image may be inserted.

In the following, respective steps are separately explained following the above-mentioned steps.

The material to be developed-supplying step according to the present invention is a step in which, by a material to be developed-supplying means, a material to be developed having at least a metal conductive layer and a photoconductive layer on the both surfaces of an insulating substrate is supplied to the position at which a registering step or a statically charging step is carried out in the next step in the case of the stepwise static charging method, and to the position at which a statically charging step is carried out in the next step in the case of the both surface simultaneous stating charging method. Specific positions of the respective methods are different depending on the means to be employed for the statically charging step or the registering step so that they are explained in the respective steps.

In either of the cases, static charging of the photoconductive layer according to the electrophotographic method is carried out under the wavelength region of an inactive light of the photoconductive layer, more preferably in a dark place so that the material to be developed having the photoconductive layer is desirably preserved in a dark place prior to static charging, and it is supplied to the next step through a material to be developed-storing means and the material to be developed-supplying means under a dark atmosphere.

As the supplying means of the material to be developed in the material to be developed-supplying step according to the present invention, any means can be used so long as it is a means capable of supplying the material to be developed, and there may be mentioned, for example, a method of using a belt stretched for the movement direction, a method of sandwiching between a pair of rolls, a method of using a plural number of rolls stretched for a right angle of the movement direction, an adhesion transfer method comprising a combination of an elastic adhesion means, a pressure reducing means and a moving means of the adhesion means, a floating (non-contact) transfer method of jetting a gas from the bottom portion of the material to be developed as well as supplying a driving force from a substantially horizontal direction, a moving method of the material to be developed while sandwiching opposite side surfaces thereof (at least the surfaces at which no photoconductive layer is formed) under pressure by a reverse V-shaped or X-shaped sandwiching means such as tweezers or scissors, a moving method of the material to be developed by providing a driving force from the bottom portion thereof by hooks such as opposing L-shaped materials simultaneously raising the same, and a method in which the above two or more methods are combined.

In the electrostatic latent image formation according to the electrophotographic method, depending on a material to be contacted with the photoconductive layer, the contacted portion affects on the electrostatic latent image even when it is contacted therewith prior to static charging so that, for supplying (conveying) the material to be developed having photoconductive layer on the both surfaces, a method of non-contacting with the photoconductive layer is preferred.

Accordingly, among these methods, the method of jetting a gas from the bottom portion of the material to be developed as well as supplying a driving force from a substantially horizontal direction, and the moving method of the material to be developed while sandwiching opposite side surfaces thereof (at least the surfaces at which no photoconductive layer is formed) under pressure by a reverse V-shaped or X-shaped sandwiching means such as tweezers or scissors are preferred.

Also, when it is supplied by the other method, the contacting portion with the photoconductive layer of the material to be developed desirably has the same composition with the photoconductive layer composition, preferably with the insulating binder resin to be used.

The material to be developed is supplied to the registering step or the statically charging step in the stepwise statically charging method and to the statically charging step in the both surface simultaneously statically charging method according to the material to be developed-supplying step.

As the statically charging method, it has been conventionally known a non-contact statically charging method such as a corotron system and a scorotron system, and a contact statically charging method such as a conductive brush statically charging or a conductive roll statically charging. As the statically charging means to be used in the statically charging step according to the present invention, either of any systems maybe employed so long as it is capable of uniformly statically charging at least the following photoconductive layer according to the present invention, but a contact statically charging method such as a conductive roll statically charging as disclosed in Japanese Provisional Patent Publication No. 263839/1995 is advantageously used irrespective of the stepwise statically charging method or the both surfaces simultaneously statically charging method. Also, a corotron system may be used.

Statically charging is carried out by moving at least one of the statically charging means and the material to be developed which is a material to be statically charged, but in either of the stepwise statically charging method or the both surfaces simultaneously statically charging method, it is preferred to carry out the procedure by moving the material to be developed due to simplification of the statically charging mechanism.

As the moving method of the material to be developed, there may be mentioned, for example, a method of using a belt stretched for the movement direction, a method of sandwiching between a pair of rolls, a method of using a plural number of rolls stretched for a right angle of the movement direction, a method of moving the material by retaining to a platen, and a method in which the above two or more methods are combined.

Different from the above-mentioned material to be developed-supplying step, in the moving means in the statically charging step, the distance from the statically charging means to the statically charging surface of the material to be developed is desirably always maintained at a constant value during statically charging even when it is contacted with the photoconductive layer.

Thus, among these methods, in the stepwise statically charging method, a platen-retaining moving system is most advantageous since it is less fluctuation in the distance between the statically charging means and the material to be developed and a transfer moving rate during statically charging procedure. Particularly in the platen-retaining moving system, it is desirable to effect statically charging while adsorbing the material to be developed to the platen by providing a vacuum adsorbing mechanism to the platen.

Also, in the stepwise statically charging method, prior to forming an electrostatic latent image on either one of the surfaces of the material to be developed, not only statically charging the surface (a first statically charging step) but also statically charging a not statically charged surface again (a second statically charging step) to form an electrostatic latent image of the photoconductive layer at the opposite surface after formation of the electrostatic latent image on the one surface. When the second statically charging step is carried out without effecting a toner developing treatment after the first statically charging step, the electrostatic latent image surface formed in the first statically charging step is contacted with the platen which is the material to be developed-retaining means, and if the platen is conductive, it sometimes exerts a bad effect to the electrostatic latent image to be contacted even if a ground or earth is not provided to the material to be developed-supporting means. Thus, it is desired that at least the material to be developed-contacting portion of the material to be developed-retaining means in the at least second statically charging step is in an insulating atmosphere.

As a method of statically charging the material to be developed-contacting portion while retaining an insulating atmosphere, there may be mentioned a statically charging method in a non-contacting state by maintaining at least the material to be developed in air, for example, by a method of discharging air from at least the upper surface of the platen containing the material to be developed-contacting portion, and a method of constituting the material to be developed-contacting portion with an insulating member. Among these methods, the non-contact statically charging method is difficult to control the distance with the statically charging means, etc., so that the method of constituting the material to be developed-contacting portion with an insulating member is simple and easy, and suitable.

In the present invention, as an insulating substance to be used for at least the material to be developed-contacting portion of the platen which is the material to be developed-retaining means, there may be mentioned a synthetic resin such as polyethylene, polypropylene, a methylpentene resin (TPX), a polyvinyl chloride resin, an acrylic resin, a styrene resin, an ABS resin, an acetal resin, a fluorine resin (Teflon, etc.), a polyamide resin, a polyester resin, a phenol resin, a xylene resin, an alkyd resin, an epoxy resin, a urea resin and a melamine resin, etc.; rubber such as chloroprene rubber, ethylene propylene rubber, butyl rubber, epichlorohydrin rubber, silicone rubber, fluorine rubber, and chlorosulfonated polyethylene rubber, a natural or synthetic (containing a resin binder type molded product) minerals and ceramics except for a group of mica.

Among these, a preferred material in the present invention is a hard synthetic resin and synthetic rubber in view of workability such as easiness in making a plane surface or strength when contacted with the material to be developed. These may comprise a single material or may be used in combination of a plural number of the materials.

On the other hand, at the platen portion other than the material to be developed-contacting portion, the same material (i.e., an insulating property) as that of the material to be developed-contacting portion, or may be used a material which has conventionally been used as a material for the platen such as a metal (i.e., a conductive) including iron, stainless and aluminum or rock such as marble.

On the other hand, in the both surfaces simultaneously statically charging method, as mentioned above, when statically charging is carried out by a contact statically charging method by the conductive roll statically charging, the roll also has a function of transfer means of the material to be developed so that it is not necessary to particularly use any other transferring means in combination. Also, even if the material to be developed has a through hole(s), when it is statically charged by the contact statically charging method, unnecessary charge is not generated at the inside of the through hole(s). Thus, when a toner image is formed by the reverse development method under a suitable bias voltage application, toner is thoroughly attached at the inside of the through hole(s) whereby a printed wiring board without breakage of line(s) in the through hole(s).

As an example of a statically charging portion in the contact statically charging method, there may be mentioned a statically charging portion comprising a discharging means and a pair of charged bodies such as conductive rollers. The material to be developed is contacted with a ground means at a metal conductive layer-exposed portion and contacted with the pair of charged bodies at the surface of the photoconductive layer. The pair of charged bodies is connected to a voltage applying means and a constant voltage is applied thereto during contacting with the material to be developed.

The charged body to be used in the contact statically charging method is preferably a material in which an elastic body containing conductive fine particles is provided around a metal core material. As the conductive fine particles, there may be employed, for example, particles of carbon black, tin oxide and titanium oxide. Also, as the elastic body, there may be mentioned, for example, urethane, natural rubber, butyl rubber, polyisoprene rubber, polybutadiene rubber, silicone rubber, styrene/butadiene rubber, and ethylene/propylene rubber. Also, at around the elastic body, a protective layer such as nylon or urethane may be provided. The shape of the charged body may be used in any shape such as a roll state, a plate state, a square block state, a spherical, a brush state and the like, but in the present invention, it is preferably used a roll state or a brush state ones.

As a measure of conductivity (insulating property) of the charged body having a conductivity in the charged body to be used in the contact statically charging method, a volume specific resistance is $10^{10}$ $\Omega \cdot cm$ or less, preferably $10^2$ to $10^7$ $\Omega \cdot cm$ or so. Also, a rubber hardness of the elastic material relates to a rubber thickness and scratch resistance or conveying property, but preferably 20 to 70° and more suitably 35 to 60°. The rubber hardness can be measured by a spring type hardness tester Type A regulated by JIS K 6301, and the measured value within the above-mentioned range measured by the hardness tester Type A is acceptable irrespective of the thickness of the rubber of the roll.

In the stepwise statically charging method, as a step immediately before or after the statically charging step, or in the both-surfaces simultaneously statically charging method, as a step immediately after the statically charging step, register of the material to be developed is carried out for forming an electrostatic latent image by exposing one surface of the photoconductive layer of the material to be developed through a wiring pattern, particularly in relation to the fact that wiring patterns at the both surfaces of an insulating substrate of the material to be developed according to the present invention are three-dimensionally joined through a through hole(s).

The registering step according to the present invention is basically constituted by a moving means for moving the material to be developed in which at least a surface opposing to an exposure means is statically charged and a position measuring means for measuring the relative position of the material to be developed, and controlled by a movement control mechanism which controls movement (registering) of the material to be developed by the moving means according to the signals from the position measuring means.

Also, in the registering step, it is necessary to set a point which becomes a standard for registering as a matter of course, but generally an exposure means which is an electrostatic latent image forming means, i.e., an exposure means provided at a predetermined position of the preparation device of the present invention is made as a standard.

The moving means to be used for the registering step according to the present invention is a means which is capable of moving the material to be developed at least to two directions which are at right angles to each other. As an example thereof, there may be mentioned a combination of rolls which are at right angles to each other in a non-contact state, a combination of a belt and a roll, a combination of belts, a sphere rotating at least two directions substantially right angles direction, a combination of a sphere rotating at least one direction and a roll or a belt, an adhesion transfer means comprising a combination of an elastic adhesion means, a pressure reducing means and an adhesive means-moving means, a floating transfer means of jetting a gas from the bottom portion of the material to be developed as well as supplying a driving force thereto from two directions which are at right angles to each other, and a combination of a sandwiching means with various kinds of shapes and systems and a sandwiching means-moving means, and a means in which a plural number of the moving means for at least one direction as mentioned above are combined. When it is a combination of rolls, at least one of the rolls is desirably a so-called skewer type roll.

In the above-mentioned moving means, when it is a combination of two or more moving means, at least one of which desirably has a mechanism of capable of effecting up-and-down movement so as not to exert any bad effect in transfer by either one of the moving means to the other.

As the position measuring means to be used in the registering step according to the present invention, there may be mentioned, for example, an optical means such as a CCD camera and an electric means such as a surface potential meter, etc.

Also, in the above-mentioned constitution, in addition to the above-mentioned combination, there may be mentioned a method in which insulating register pins are planted to two side surfaces which are mutually cross with each other of the material to be developed with three points at two directions on the platen, and then the material to be developed is pressed from the counter direction by the material to be developed-pressing means whereby register is carried out.

Moreover, the technique disclosed in Japanese Provisional Patent Publication No. 222511/1996 may be applied to the present invention. That is, by receiving an information regarding the position of a predetermined standard pattern formed on the material to be developed as well as an electrostatic latent image exposure information, adjusting the relative position of a detecting means which detects. the predetermined standard pattern and the material to be developed based on the information regarding the position of the predetermined standard pattern, and, based on the detected result of the detecting means, adjusting the relative value of the material to be developed and the electrostatic latent image exposure information based on the difference between the position of the predetermined standard pattern and the information regarding the position of the predetermined standard pattern, whereby registering can be carried out.

On the other hand, when the registering step according to the present invention is a post-step of the statically charging step, it is preferred in the registering step to provide a surface potential measuring means at the position at which the surface potential of the statically charged material to be developed can be measured.

That is, when the surface potential of the statically charged material to be developed is measured and the difference between the surface potential and the standard value is compared, if the measured value is markedly out of the standard value, it can be found that there is any inconvenience at least either one of (a film thickness of) the photoconductive layer of the material to be developed or the statically charging means when there is no problem in the measurement system itself.

Also, when the statically charged material to be developed is moved under the surface potential measuring means, when the statically charged material to be developed is moved close to the surface potential measuring means, the measured potential is markedly changed so that alignment of the statically charged material to be developed can be carried out without contact.

Also, particularly when the material to be developed has a through hole(s), if the through hole portion is passed through under the surface potential measuring means, a potential difference can be confirmed. Thus, with regard to alignment of the statically charged material to be developed, by measuring the surface potentials at the group of through holes and around the same, alignment with a higher precision based on the positional relationship between through holes can be realized so that it is more preferred.

Also, in alignment of the material to be developed, the relative positions of an exposed image and the material to be developed are important, and for the alignment, either one of the exposed image or the material to be developed, or both of them may be moved. That is, in the surface exposure using a photomask, a movement of the exposed image is a movement of the photomask. In the case of scanning exposure using a laser or a luminous diode without using a photomask, a movement of the exposed image becomes change of the exposed position of the data.

With regard to the movement of the material to be developed, alignment of the material to be developed can be carried out by transferring the platen to the exposed image without changing the positional relationship between the platen and the material to be developed. Also, alignment of the material to be developed may be carried out by transferring the position of the material to be developed on the platen without changing the positional relationship between the platen and the material to be developed.

The material to be developed in which at least one surface of the photoconductive layers is applied to statically charging and subjected to registering before or after the charging is subjected to image exposure at the statically charged portion by the conventionally known manner in the subsequent exposure step to form an electrostatic latent image.

As the exposure method, there may be mentioned, for example, a reflective image exposure using a xenon lamp, a tungsten lamp, a fluorescent light, etc. as a light source, a closely contact exposure through a transparent positive film, or a scanning exposure by a laser beam, a luminous diode, etc. As a light source in the scanning exposure, a laser light source such as a He—Ne laser, an argon ion laser, a krypton ion laser, a ruby laser, a YAG laser, a nitrogen laser, a dye laser, an eximer laser, a semiconductor layer such as GaAs/GaAlAs and InGaAsP, can be utilized, or else, a scanning exposure (including a line printer type light source using a light emitting diode array, a liquid crystal array, etc.) may be carried out utilizing a luminous diode or a liquid crystal shutter.

As an exposure method, by using the scanning exposure system using a light emitting diode array, it is possible to directly expose the data from a computer without through a film so that the process can be simplified, and also, preparation of a printed wiring board can be carried out by a cheap, simple and easy optical adjustment since it is a light emitting diode array and no complicated optical system such as a polygon mirror or a fθ lens is used, whereby it is preferred. The photoconductive layer according to the present invention has high sensitivity so that it can be sufficiently exposed by a luminous diode which has a weak energy than that of a laser.

A laser image-drawing device which exposes a substrate using a photopolymer according to the preparation device of the printed wiring board is disclosed in Japanese Provisional Patent Publications No. 35993/1995 and No. 35994/1995, and these laser image-drawing device can be applied to the present invention.

Particularly when the scanning exposure system is used as an exposure means, it is carried out by moving at least either one of the exposure systems or the material to be developed during at least exposure. Formation of the electrostatic image by the exposure sometimes determines the product quality of the final printed image in the printed wiring board. Thus, if either one of which is to be transferred, it is preferred to transfer (a material to be developed-retaining means for retaining) the material to be developed.

When exposure is carried out while transferring at least the exposure means due to the reasons of the structural or preparation system of the preparation device, it is necessary to control not only a main scanning direction (X), a sub scanning direction (Y), and an exposure gap (Z), but also swing and tilt (inclination, twist, surging, etc.: θ) of the exposed surface in the material to be developed which is a subject to be exposed.

Also, at the time of statically charging, it is necessary to ground the metal conductive layer of the material to be developed, and any grounding means is contacted thereto or connected thereto.

The material to be developed in the present invention has photoconductive layers on the both surfaces so that by utilizing the portion other than the photoconductive layer formed surface of the material to be developed, i.e., the side surface portion (of the metal conductive layer) of the material to be developed, it is electrically grounded.

As a grounding method at the side surface portion of the material to be developed, there may be mentioned, for example, a method of previously attaching a lead wire at the side surface portion of the material to be developed and ground is carried out through the portion, and a method of providing a grounding means at an exposure portion platen or around thereof, and contacting with the grounding means at least at the time of statically charging.

At least the portion contacting with the material to be developed of the grounding means to be used in the present invention is preferably a material which has at least a conductive property as a matter of course, exerts no influence to the material to be developed and the statically charged surface, and the contacted portion is not suffered from a damage or deterioration by the material to be developed or a liquid developer.

As an example of the contacting portion with the material to be developed in the grounding means to be used in the present invention, there may be mentioned copper, iron, aluminum or silver having elasticity, a metal structural material comprising an alloy such as a stainless, and rubber structural materials such as acrylonitrile-butadiene copolymerized rubber (formulated therein a conductive material), urethane rubber, isoprene-acrylonitrile copolymerized rubber and fluorine rubber, etc. having a statically charging property, and particularly for ensuring ground, a material made of a metal excellent in conductivity is preferred.

Also, among these, a material in which the material itself difficultly develops elastic properties may be developed its elastic properties by the shape thereof. Specific examples of the shape may include a brush state, a spring state, and a spatula (a thin plate) state, etc. and a structural material in which the above is combined to each other.

Also, by making a roll state, the same effects can be obtained when the roll is smoothly rotated (less friction) with a progress of the material to be developed and a roll shaft or its fixed portion shows elastic properties even when the portion of the roll to be contacted with the material to be developed does not particularly have elastic properties, and it can be used in the present invention.

When a rubber structural material is used at the portion of the grounding means at least contacting with the material to be developed, it is best to be good in conductivity, but as a measure of the conductivity in the present invention, a volume specific resistance is $10^2$ to $10^8$ Ω·cm or o, preferably $10^4$ to $10^8$ Ω·cm or so. As a feeding roll according to the present invention, use of a conductive roll to which the above-mentioned conductive particles are formulated to control the resistance value at the rubber portion is preferred.

After supplying the material to be developed by the material to be developed-supplying step, by effecting the registering step, the statically charging step and the exposure step in this order, the material to be developed in which an electrostatic latent image is formed on one surface thereof is reversed to form an electrostatic latent image on the other surface thereof by the material to be developed-reversing step.

As a reversing means of the material to be developed in the material to be developed-reversing step, there may be. mentioned, for example, a method of adsorbing the material to be developed to a reduced pressure adsorption pad or a reduced pressure adsorbing plate, etc. and reversing the same with these reduced pressure adsorbing means, a method of reversing the material to be developed by sandwiching at least two side surfaces opposed to each other (the surface in the thickness direction) of the material to be developed, preferably at least two side surfaces parallel to the moving direction with a sandwiching means while sandwiching under pressure and rotating the sandwiching means to reverse the material, a method of reversing the same by using two pair of a material to be developed (one surface) retaining means opposed to each other, and changing the retaining surface of the material to be developed from one retaining means to the other retaining means, and a method of using the above methods in combination.

Of these, in the method of reversing the material to be developed by retaining the photoconductive layers thereof and passing a step of contacting with the electrostatic latent image-formed surface at any time during the reversing procedure, there is a possibility of disturbing the electrostatic latent image as mentioned above so that it is not preferred and a method of reversing the material by retaining other than the electrostatic latent image-formed surface is preferred.

The material to be developed which is reversed in the material to be developed-reversing step is, in the stepwise statically charging method, in the same manner as in the above-mentioned respective procedure in the first step, subjected to the respective steps of the statically charging step subsequent the registering step or the registering step subsequent to the statically charging step, and the exposing step whereby electrostatic latent images are formed on the photoconductive layer at the both surfaces of the material to be developed.

Also, in the both surfaces simultaneously statically charging method, statically charging is carried out to the both surfaces in the above-mentioned first step, so that by subjecting to the registering step and the exposure step, electrostatic latent images are formed on the photoconductive layer at the both surfaces of the material to be developed.

Also, when the toner developing treatment is carried out between the first step and the second step, reversing of the material to be developed is carried out before or after the first toner developing treatment step and proceeds to the second step. Also, in the case of the both surfaces simultaneously statically charging method, after the first toner developing treatment and before the second step, both surfaces simultaneously statically charging is again carried out.

In the steps in the preparation of the printed wiring board according to the present invention as mentioned above, in either of the stepwise statically charging method or the both surfaces simultaneously statically charging method, the respective steps of the first registering step, the first statically charging step and the first exposing step and the respective steps of the second registering step, the second statically charging step (provided that it is not necessarily required in the both surfaces simultaneously statically charging method), and the second exposure step may be the same system or different system.

Also, when the same system is employed, one procedural device constituting the preparation device of the present invention may be used in the same step of the both surfaces of the material to be developed or two or more procedural devices may be incorporated even when it is the same system.

As the developing method in the toner developing treatment method according to the present invention, it may be used any methods, for example, a reverse developing method of reversing an exposed portion by using a liquid developer (toner) containing toner particles having the same polarity as that of the electrostatic latent image, or the normal developing method of developing an unexposed portion by using a liquid developer containing toner particles having the reverse polarity as that of the electrostatic latent image. In the reverse developing method as a matter of course, and also in the normal developing method, it is preferred to apply a bias voltage to prevent attachment of toner particles at the non-image portion or pinhole, etc. at the solid portion.

As a system in the device for effecting the toner developing treatment according to the present invention, there may be mentioned, for example, systems such as one-surface transverse horizontal development in which an electrostatic latent image formed surface of a material to be developed which had conventionally been used is conveyed substantially horizontally to the vertical direction and liquid is supplied to one surface thereof from the upper surface or the lower surface, one-surface lateral horizontal development in which a material to be developed is put up and conveyed substantially horizontally and liquid is supplied to one surface thereof as disclosed in Japanese Provisional Patent Publication No. 91649/1990, both-surfaces transverse horizontal development in which a material to be developed is laid and conveyed substantially horizontally and liquid is supplied to both sides thereof from up and down as disclosed in Japanese Provisional Patent Publication No. 224541/1994, both-surfaces lateral horizontal development in which a material to be developed is put up and conveyed substantially horizontally and liquid is supplied to both surfaces thereof as disclosed in Japanese Patent Application No. 298363/1996 which was published under Japanese Provisional Patent Publication No. 142949/1998, and also, whereas it is particularly suitable for a flexible plate, development in which a material to be developed is put up and conveyed from upper portion and liquid is supplied to the both surfaces thereof before or after conveying the same by changing the direction to substantially horizontal direction.

In either of the above-mentioned cases, at the side to which supply of toner to a substrate is carried out, development electrodes comprising a conductive member are provided at the opposed position with a certain distance substantially parallel to the substrate, and a development bias voltage is applied to the development electrodes between the electrodes and the metal conductive layers of the substrate as zero volt (0 V). In the case of reverse development, a bias voltage is applied to the development electrodes with the same polarity as the toner particles, and act on the toner particles supplied to gap(s) between the development electrodes and the substrate, whereby attachment of the toner to the exposed portion of the substrate, i.e., to the charge disappeared portion of the electrostatic latent image formed surface is promoted.

Figure 3:
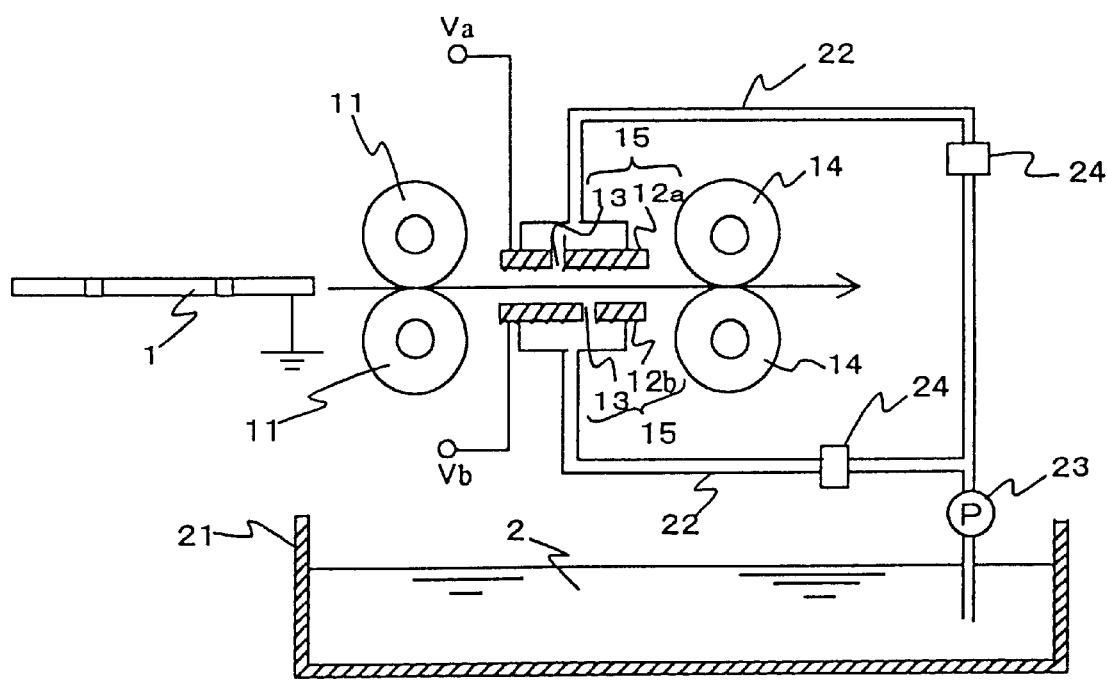
FIG. 3 is a sectional view of a constitution of one example of a toner-developing device to be used in the present invention.

In the following, with regard to the toner developing treatment step according to the present invention, one example of the toner developing portion of a toner developing treatment device using a liquid developer is shown in FIG. 3, and is explained in more detail by using the same. The toner developing treatment device to be suitably used in the present invention comprises a toner development portion, a drying portion and a thermal fixing portion. According to the above-mentioned statically charging and exposure treatments, the material to be developed 1 to which an electrostatic latent image is formed on the photoconductive layer surface is conveyed by a conveying means such as a pair of conveying rolls 11 to a developing electrode 15 of the toner developing portion, and after the toner developing treatment is applied at the developing electrodes portion 15, it is carried out to a drying portion and a thermally fixing portion which are not shown by a pair of liquid squeezing rolls 14. The material to be developed is subjected to toner developing treatment at the toner developing portion, and then, evaporation and removal of a dispersant in the liquid developer remained at the surface of the photoconductive layer are carried out whereby the toner particles are thermally fixed on the photoconductive layer at the thermally fixing portion.

The toner developing portion is constituted by a developing electrodes portion 15 at which a liquid developer is supplied to the material to be developed to apply the toner developing treatment to the substrate, a conveying means 11 in which the substrate is conveyed to the developing electrode portion, and a pair of liquid squeezing rolls 14 at which the material to be developed is sandwiched and conveyed to the drying portion and an excessive liquid developer remained on the photoconductive layer is squeezed. A liquid developer 2 is stored in a liquid developer storing tank 21 and supplied by a liquid feeding means to the developing electrode portion 15.

The developing electrodes portion 15 comprises a pair of developing electrodes 12a and 12b (12a: a developing electrode at the first step of an upper side, 12b: a developing electrode at the first step of the lower side), a toner feed opening 13 which supplies the liquid developer 2 stored in the liquid developer storing tank 21 to the gap(s) of the to the gap(s) between the pair of the developing electrodes 12a and 12b, and a bias voltage (Va, Vb) applying means is connected to the pair of the developing electrodes 12a and 12b, and it is constituted that a bias voltage can be applied to the electrostatic latent image formed surface of the material to be developed.

A liquid supplying means comprises a liquid feeding pump 23, a liquid amount adjusting valve 24 and a liquid feeding pipe 22, and by actuating the liquid feeding pump 23, the liquid developer 2 is supplied to the toner feed opening 13 from the liquid developer storing tank 21 and through the liquid amount adjusting valve 24. A feed rate of the liquid developer 2 to the material to be developed is controlled by the liquid amount adjusting valve 24 so as to become the same discharged pressure from the toner feed opening 13 at the both surfaces of the material to be developed.

The toner developing treatment according to the present invention is carried out as mentioned below. Both surfaces of a material to be developed in which metal conductive layers are laminated on the surface of an insulating substrate having a through hole(s) and a photoconductive layer is provided thereon are statically charged in a dark place, and then, one surface (which is called as the surface A) thereof is subjected to pattern exposure to form an electrostatic latent image. Thereafter, the first treatment is carried out by the toner developing treatment device as shown in FIG. 3, and at that time, at the opposed side to the surface A of the two developing electrodes, a bias voltage suitable for developing the wiring pattern at the surface A is applied to the side opposed to the surface A of the two developing electrodes. Thereafter, drying and thermal fixing of the toner particles are carried out, then, statically charging is carried out again on the both surfaces of the material to be developed and pattern exposure is carried out on the other surface (which is called as the surface B) at this time to form an electrostatic latent image of the wiring pattern. Then, the second treatment is carried out by the toner developing treatment device of FIG. 3, and at this time, a bias voltage suitable for developing the wiring pattern is applied to the electrode at the side opposed to the surface B. Then, by effecting drying and thermal fixing, toner images are formed on the both surfaces.

At this time, a bias voltage suitable for developing the wiring pattern may vary depending on the constitution of the developing electrode portion and the developing conditions such as a conveying rate, etc., but generally selected between 10 V or more to the voltage value 1.5 times the surface potential of the electrostatic latent image. If the bias voltage is too low, sufficient toner particles are not attached to the image portion to cause image defect. At the time of preparing a wiring board, the former becomes a cause of wire breakage and the latter becomes a cause of shortage. Accordingly, for determining the suitable bias voltage in actual manner, by gradually changing a bias voltage, the bias voltage at which a toner attached amount at the image portion is sufficient and no toner particles attached at the non-image portion is set as a suitable bias voltage.

To another electrode of the pair of the developing electrodes, i.e., to an electrode opposing to the surface at which no electrostatic latent image is formed of the material to be developed, a voltage lower than the bias voltage suitable for developing the above-mentioned wiring pattern is desirably applied. Preferably it is set substantially 0 V. That is, it is made an earth electrode having the same potential of the metal conductive layer of the material to be developed. According to this, not only developing the effects of the present invention well, but a voltage applying means is not necessary in this electrode and the constitution of the toner developing treatment device is simplified.

Figure 4:
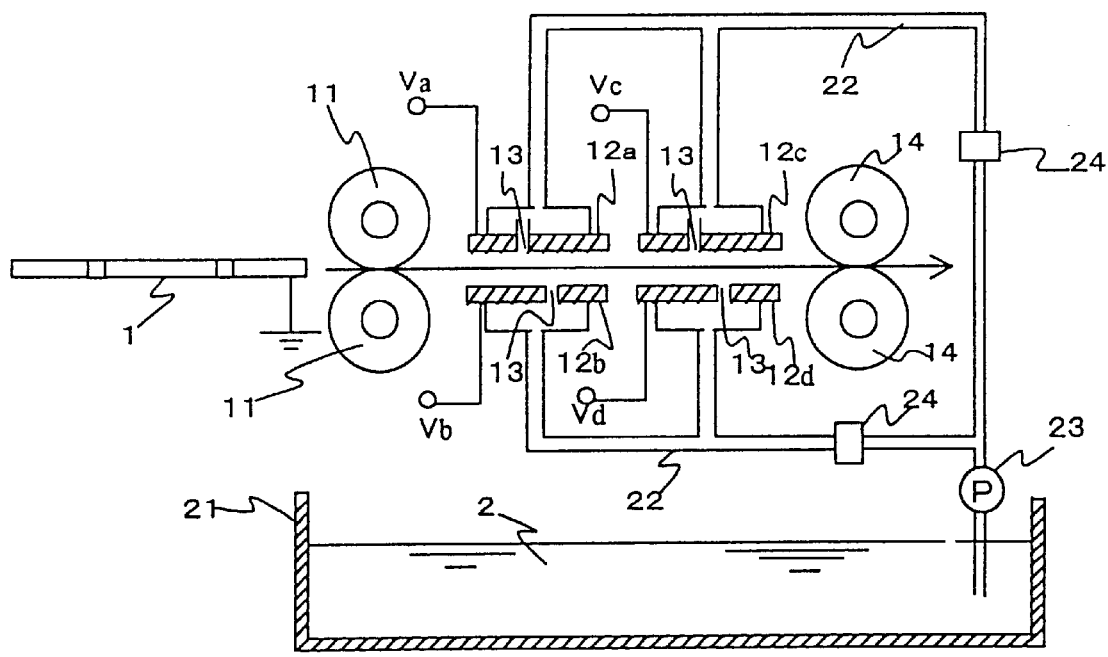
FIG. 4 is a sectional view of a constitution of other example of a toner-developing device to be used in the present invention.

Also, the method of claim 5 of the present invention develops the same effect by a development as the above-mentioned two times of developments, and one example of the toner developing treatment device for realizing the method is that a developing electrode to which at least two different bias voltages are applied is provided at one side as shown in FIG. 4.

In this case, after forming electrostatic latent images on the both surfaces by effecting statically charging and exposure at the both surfaces, toner-developing treatment is carried out. To at least one of a plural number of developing electrodes at the respective sides of the developing electrode portion, it is desirable to apply a bias voltage suitable for developing the wiring pattern as already explained, and to the other electrodes, a bias voltage lower than the voltage is applied. As mentioned above, at least one of the plural number of electrodes at one side may be 0 V, i.e., an earth electrode.

The material to be developed to which a toner image is formed is then subjected to dissolution and removal of the photoconductive layer other than the toner image portion to form an etching resist comprising the toner image and the photoconductive layer, and the exposed metal conductive layer is removed by etching, and further the remaining etching resist is removed, if necessary, to produce a printed wiring board.

The roll in the pair of conveying rolls comprises an axis and an elastic body provided at the outer surface thereof. As the axis, for example, in addition to metal such as iron, stainless and aluminum, a hard resin may be used. For lightweight or molding, the axis may be a hollow axis or metal and a hard resin may be used in combination.

Also, as an elastic body, rubber comprising a component having a little solubility to a hydrocarbon or a solvent is preferred, and there may be mentioned, for example, acrylonitrile-butadiene copolymerized rubber (NBR), urethane rubber, isoprene-acrylonitrile copolymerized rubber, chloroprene rubber, acryl rubber, chlorosulfonated polyethylene rubber, polysulfated rubber, silicone rubber and fluorine rubber. Of these, in the points of abrasion resistance, solvent resistance, workability and costs, NBR containing a much amount of acrylonitrile is excellent. To these rubbers, an additive such as a filler for reinforcing, a filler for increasing amount, a dispersibility improving agent, an adhesiveness improving agent, a heat resistant additive, an antioxidant, a colorant, a cross-linking agent, and a curing agent may be added in the range which does not participate solvent resistance, etc.

The rubber hardness in the pair of the conveying rolls is preferably in the range of 30 to 70°, more suitably in the range of 35 to 60°. The rubber hardness can be measured by the spring type hardness tester Type A regulated by JIS K 6301, and the measured value within the above-mentioned range is acceptable irrespective of the thickness of the rubber of the roll.

The pair of squeezing rolls may be the same material as in the above-mentioned pair of the conveying rolls or, as disclosed in Japanese Provisional Patent Publication No. 76603/1996, a material in which a liquid-absorbing member having a capillarity function may be used as the elastic body. Particularly when the same material as in the pair of the conveying rolls is used, a vapor blowing means as disclosed in the Japanese Provisional Patent Publication No.245462/1995 may be provided at the end portion of the conveying means.

On the other hand, as the liquid-absorbing member, there may be mentioned, for example an elastic body such as natural rubber, butyl rubber, urethane rubber and acrylonitrile-butadiene copolymerized rubber, etc. is made a sponge structure, or woven fabric, non-woven fabric and resin-impregnated materials thereof. When a liquid-absorbing roll using a liquid-absorbing member having capillary function is used as an elastic body in the pair of the squeezing rolls, a reduced-pressure suction means connecting to the liquid-absorbing roll is provided and excessive liquid developer composition obtained by liquid-absorption may be discharged. As a specific example of the pair of the liquid-absorbing rolls, non-woven fabric with a basis weight of 70 g/m$^2$ is wound to the axis made of SUS 304 with a plural layers may be used.

At the neighbor of the pair of the conveying rolls and the pair of the squeezing rolls, as mentioned above, it is desired to provide a grounding mechanism so provided as to contact with the metal conductive layer at the side edge portion or the side surface of the material to be developed. A power source is connected to the pair of the developing electrode and the grounding mechanism, and when reverse development is to be carried out, a bias voltage is applied to the material to be developed. The bias voltage to be applied to is determined by a plural number of factors including factors based on the materials such as a kind of the photoconductive layer or the liquid developer, surface potentials at the statically charged portion and non-statically charged portion of the electrostatic latent image, a distance between the developing electrode and the material to be developed, and factors of developing conditions such as a conveying rate of the material to be developed or the like.

The liquid developer to be used in the present invention may be used those conventionally used for electrophotographic printing plate, but it must be those having a resistance against dissolution and removal of the photoconductive layer at the non-circuit portion in the post-treatment. Thus, as the toner particle component in the liquid developer, there may be preferably used, for example, an acrylic resin comprising methacrylic acid, a methacrylate, etc., a vinyl acetate resin, a copolymer of vinyl acetate and ethylene or vinyl chloride, etc., a vinyl chloride resin, a vinylidene chloride resin, a vinyl acetal resin such as polyvinylbutyral, polystyrene, a copolymerized material of styrene and butadiene or a methacrylate(s), etc., polyethylene, polypropylene and chloride thereof, a polyester resin such as polyethylene terephthalate, polyethylene isophthalate, etc., a polyamide resin, a phenol resin, a xylene resin, an alkyd resin, a vinyl-modified alkyd resin, gelatin, a cellulose ester derivative such as carboxymethyl cellulose, etc., and wax.

Also, a dye or a charge controller may be added to the liquid developer in the range which does not exert any bad effect to development or fixing, etc. Moreover, the charge shall be selected to be positive or negative based on the photoconductive compound to be used and statically charging polarity.

Next, the material to be developed according to the present invention is explained.

The material to be developed is a material which can finally form a wiring pattern of the metal conductive layer on the both surfaces of the insulating substrate as a printed wiring board, and at least one step for formation of the wiring pattern is carried out by utilizing a electrophotographic method. More specifically, in metal conductive layers provided uniformly on the whole surface of the both surfaces of an insulating substrate, electrophotographic photoconductive layers capable of forming at a toner image on at least the metal conductive layers for forming a main part of a resist at the time of removing an unnecessary portion other than the wiring pattern portion by the electrophotographic method. That is, the material to be developed according to the present invention is a material to be developed having at least a metal conductive layer and a photoconductive layer on the both surfaces of an insulating plate in this order.

Also, as the material to be developed which is to be used for preparing a printed wiring board having a through hole(s), a material to be developed in which a through hole(s) is/are provided to a laminated board to which first metal conductive layers are provided on the both surfaces of an insulating substrate, a metal plating treatment is carried out to provide second metal conductive layers at inside of the through hole(s) and the surface of the laminated board, and then, photoconductive layers are provided on the second metal conductive layers (in the following, this material to be developed is described as a material to be developed having a through hole(s)) is suitable for preparing the printed wiring board of the present invention.

As the insulating substrate according to the present invention, there may be mentioned, for example, a glass-base epoxy plate, a paper-base phenol resin plate, a paper-base epoxy resin plate, a glass-base polyimide resin plate, a polyester film, a polyimide film, a polyamide film and a polyvinyl fluoride film, etc.

Also, the thickness of the insulating substrate is 80 $\mu$m to 3.2 mm or so, and the material and the thickness are selected based on the final state to be used as a printed wiring board. With regard to a thin substrate, a plural number of sheets thereof may be laminated and used.

Also, as metal to be used for the metal conductive layer to be provided on the both surfaces, particularly as metal to be used for the first metal conductive layer, there may be mentioned, for example, metal and alloy such as copper, silver, aluminum, stainless, nichrome (nickel-chromium alloy) and tungsten, etc.

The thickness of the metal conductive layer is generally 5 to 35 $\mu$m, and for obtaining a high resolution, the thickness of the first metal conductive layer is preferably thin.

As these laminated boards in which metal conductive layers are provided on the insulating substrate, those described in "Print Circuit Technique Handbook, Second Edition" (Edited by a Corporation of Print Circuit Association, published in 1993, published by Nikkan Kogyo Shinbunsha) can be used.

The support to be provided photoconductive layers according to the material to be developed having a through hole(s) is prepared by opening a penetrating pore(s), i.e., a through hole(s) having a desired diameter to the above-mentioned laminated board, then, a metal plating treatment is applied to form second metal conductive layer to the inside of the through hole(s) and the surface of the laminated board. As the second metal conductive layer, copper is most frequently used, and when the metal to be used for the second metal conductive layer is copper, lamination can be carried out by electroless copper plating-electroplating of copper step, direct plating step, etc. as disclosed in "Surface Practically Applying Technique" (No. 6, 1993, published by Nikkan Kogyo Shinbunsha).

The printed wiring board obtained by the preparation method and preparation device of the present invention can be provided wiring patterns on at least its both surfaces of the insulating substrate. In such a multi-layered wiring board having two or more structured-wiring patterns, space between layers may sometimes be connected with a through hole(s), a via hole(s), etc.

A photoconductive layer is provided on the metal conductive layer of the laminated board as mentioned above, and between the laminated board and the photoconductive layer, for improving adhesiveness or electrophotographic properties, an intermediate layer comprising casein, polyvinyl alcohol, hydroxyethyl cellulose, a phenol resin, a styrene/maleic anhydride copolymer, a maleic acid/acrylic acid copolymer, an acrylic acid/methacrylic acid copolymer, polyacrylic acid, and an alkali metal salt and/or ammonium salt of these polymer electrolytes, ethanol amines and their hydrochloride, oxalate, phosphate, citric acid, a hydroxycarboxylic acid such as tartaric acid, etc., and a salt thereof, an amino acid such as glycine, alanine, glutamic acid, etc., an aliphatic aminosulfonic acid such as sulfamic acid, a (poly) aminopolyacetic acid such as ethylenediaminetetraacetic acid, nitrilotriacetic acid, triethylenetetraminehexaacetic acid, etc., a (poly)aminopoly(methylenephosphonic acid) such as aminotri(methylenephosphonic)acid, 1-hydroxyethyliden-1,1-diphosphonic acid, ethylenediaminetetra(methylenephosphonic acid), etc. and their analogues, and at least part of acid groups of these compounds is an alkali metal salt or ammonium salt, if necessary.

In the intermediate layer, fine particles of, for example, titanium oxide, alumina, silica, zirconia and antimony oxide, etc. may be further used in combination. The thickness of the intermediate layer is not particularly limited, but an object is to improve adhesiveness of the photoconductive layer, it may be at most 10 $\mu$m or so irrespective of the laminated board to be used. Also, if an electroconductivity of the intermediate layer is low, spread of charge of the photoconductive layer is difficultly caused and photosensitivity is lowered so that resolution of the toner image is lowered whereby the electroconductivity of the intermediate layer is preferably $10^{-9}$ S/cm or more.

By providing a photoconductive layer on the both surfaces of the above-mentioned laminated board, it becomes a material to be developed of the present invention.

The photoconductive layer according to the present invention contains at least a photoconductive compound. As the photoconductive compound to be used in the present invention, there may be mentioned an organic and inorganic photoconductive compound. Examples of the inorganic photoconductive compounds may include selenium and selenium alloy, amorphous silicon, cadmiumsulfide, zinc oxide, zinc sulfide, titaniumoxide, etc. Also, examples of the organic photoconductive compounds may include a) a triazole derivative as disclosed in the specification of U.S. Pat. No. 3,112,197, etc., b) an oxadiazole derivative as disclosed in the specification of U.S. Pat. No. 3,189,447, etc., c) an imidazole derivative as disclosed in Japanese Patent Publication No. 16096/1962, etc., d) a polyarylalkane derivative as disclosed in the specifications of U.S. Pat. No. 3,542,544, U.S. Pat. No. 3,615,403 and U.S. Pat. No. 3,820,989, Japanese Patent Publications No. 555/1970 and No. 10983/1976, and Japanese Provisional Patent Publications No. 93224/1976, No. 108667/1980, No. 156953/1980 and No. 36656/1981, etc., e) a pyrazoline derivative and a pyrazolone derivative as disclosed in the specifications of U.S. Pat. No. 3,180,792 and U.S. Pat. No. 4,278,746, and Japanese Provisional Patent Publications No. 88064/1980, No. 88065/1980, No. 105537/1974, No. 51086/1980, No. 80051/1981, No. 88141/1981, No. 45545/1982, No. 112637/1979 and No. 74546/1980, etc., f) a phenylenediamine derivative as disclosed in the specification of U.S. Pat. No. 3,615,404, Japanese Patent Publications No. 10105/1976, No. 3712/1971 and No. 28336/1972, and Japanese Provisional Patent Publications No. 83435/1979, No. 110836/1979 and No. 119925/1979, etc., g) an arylamine derivative as disclosed in the specifications of U.S. Pat. No. 3,567,405, No. 3,180,703, No.

3,240,597, No. 3,658,520, No. 4,232,103, No. 4,175,961 and No. 4,012,376, West German Patent (DAS) No. 1,110,518, Japanese Patent Publications No. 35702/1974 and No. 27577/1964, and Japanese Provisional Patent Publications No. 144250/1980, No. 119132/1981 and No. 22437/1981, etc., h) an amino-substituted chalcone derivative as disclosed in the specification of U.S. Pat. No. 3,526,501, etc., i) a N,N-bicarbazyl derivative as disclosed in the specification of U.S. Pat. No. 3,542,546, etc., j) an oxazole derivative disclosed in the specification of U.S. Pat. No. 3,257,203, etc., k) a styrylanthracene derivative as disclosed in Japanese Provisional Patent Publication No. 46234/1981, etc., l) a fluorenone derivative as disclosed in Japanese Provisional Patent Publication No. 110837/1979, etc., m) a hydrazone derivative as disclosed in the specification of U.S. Pat. No. 3,717,462, Japanese Provisional Patent Publications No. 59143/1979 (which corresponds to U.S. Pat. No. 4,150,987), No. 52063/1980, No. 52064/1980, No. 46760/1980, No. 85495/1980, No. 11350/1982, No. 148749/1982 and No. 104144/1982, etc., n) a benzidine derivative as disclosed in the specifications of U.S. Pat. No. 4,047,948, U.S. Pat. No. 4,047,949, U.S. Pat. No. 4,265,990, U.S. Pat. No. 4,273,846, U.S. Pat. No 4,299,897 and U.S. Pat. No. 4,306,008, etc., o) a stilbene derivative as disclosed in Japanese Provisional Patent Publications No. 190953/1983, No. 95540/1984, No. 97148/1984, No. 195658/1984 and No. 36674/1987, etc., p) a polyvinyl carbazole derivative as disclosed in Japanese Patent Publication No. 10966/1959, etc., q) a vinyl polymer such as polyvinylpyrene, polyvinyl anthracene, poly-2-vinyl-4-(4'-dimethylaminophenyl)-5-phenyloxazole and poly-3-vinyl-N-ethylacarbazole, etc., as disclosed in Japanese Patent Publications No. 18674/1968 and No. 19192/1968, etc., r) a polymer such as polyacenaphthylene, polyindene and an acenaphthylene/styrene copolymer, etc. as disclosed in Japanese Patent Publication No. 19193/1968, etc., s) a condensed resin such as a pyrene/formaldehyde resin and an ethylcarbazole/formaldehyde resin as disclosed in Japanese Patent Publication No. 13940/1981, etc., t) various kinds of triphenylmethane polymers as disclosed in Japanese Provisional Patent Publications No. 90883/1981 and No. 161550/1981, etc., u) a non-metal or metal (oxide) phthalocyanine and naphthalocyanine, and derivatives thereof as disclosed in the specification of U.S. Pat. No. 3,397,086 and U.S. Pat. No. 4,666,802, Japanese Provisional Patent Publications No. 90827/1976, No. 2061/1989 and No. 4389/1989, etc.

The organic photoconductive compound according to the present invention is not limited to the compound mentioned in a) to u), and other organic photoconductive compound can be used. These organic photoconductive compound may be used in combination of two or more kinds thereof.

Also, in the photoconductive layer according to the present invention, various kinds of pigments, dyes, etc., may be used in combination for the purpose of improving sensitivity of the photoconductive layer or giving sensitivity to a determined wavelength region. Examples thereof may be mentioned 1) a monoazo, bisazo or trisazo pigment as disclosed in the specifications of U.S. Pat. No. 4,436,800 and U.S. Pat. No. 4,439,506, Japanese Provisional Patent Publications No. 37543/1972, No. 123541/1983, No. 192042/1983, No. 219263/1983, No. 78356/1984, No. 179746/1985, No. 148453/1986 and No. 238063/1986, and Japanese Patent Publications No. 5941/1985 and No. 45664/1985, etc., 2) a perylene type pigment as disclosed in the specification of U.S. Pat. No. 3,371,884, etc., 3) an indigo or thioindigo derivative as disclosed in the specification of British Patent No. 2,237,680, etc., 4) a quinacridone type derivative as disclosed in the specification of British Patent No. 2,237,679, etc., 5) a polycyclic quinone type pigment as disclosed in the specification of British Patent No. 2,237,678, and Japanese Provisional Patent Publications No. 184348/1984 and No. 28738/1987, etc., 6) a bisbenzimidazole type pigment as disclosed in Japanese Provisional Patent Publication No. 30331/1972, etc., 7) a squalirium salt type pigment as disclosed in the specifications of U.S. Pat. No. 4,396,610 and U.S. Pat. No. 4,644,082, etc., 8) an azulenium salt type pigment as disclosed in Japanese Provisional Patent Publications No. 53850/1984 and No. 212542/1986, etc.

Also, as a sensitizing dye, known compounds as disclosed in "Electrophotography", vol. 129 (1973), "Organic Synthesis Chemistry", vol. 24, No. 11, p. 1010 (1966), etc. maybe used.

Examples thereof may be mentioned 9) a pyrilium type dye as disclosed in the specifications of U.S. Pat. No. 3,141,770 and U.S. Pat. No. 4,283,475, Japanese Patent Publication No. 25658/1973, and Japanese Provisional Patent Publication No. 71965/1986, etc., 10) a triarylmethane type dye as disclosed in Applied Optics Supplement, vol. 3, p. 50 (1969) and Japanese Provisional Patent Publication No. 39548/1975, etc., 11) a cyanine type dye as disclosed in the specification of U.S. Pat. No. 3,597,196, etc., 12) a styryl type dye as disclosed in Japanese Provisional Patent Publications No. 164588/1984, No. 163047/1985 and No. 252517/1985, etc.

These sensitizing dyes may be used singly or in combination of two or more kinds thereof.

In the photoconductive layer according to the present invention, a compound such as trinitrofluorenone, chloranyl and tetracyanoethylene, etc., a compound as disclosed in Japanese Provisional Patent Publications No. 65439/1983, No. 102239/1983, No. 129439/1983 and No. 71965/1985, etc. may be further used in combination.

In the photoconductive layer according to the present invention, in addition to the above-mentioned photoconductive compound, a binder resin is preferably contained. The binder resin to be used in the present invention must satisfy the electrophotographic properties including statically charging properties, etc., and have solubility in a dissolving solution.

As the dissolving solution, an acidic or an alkaline liquid may be used, but when the acidic dissolving solution is used, an acid-soluble binder resin is used as the binder resin while when the alkaline dissolving solution is used, an alkali-soluble binder resin is used.

Among the binder resins to be used in the present invention, as the alkali-soluble binder resin, there may be mentioned a copolymer comprising a monomer having a carboxylic acid group, methacrylic acid amide, a phenolic hydroxyl group, a sulfonic acid group, a sulfonamide group, a sulfonimide group, a phosphonic acid group, a phenol resin, a xylene resin, etc.

Among these, a copolymer comprising a monomer having a carboxylic group and a phenol resin are most advantageously used since they have high statically charge-retaining property. As the copolymer comprising a monomer having a carboxylic acid group, there may be preferably mentioned a copolymer of styrene and maleic acid monoester, a binary or more of copolymer comprising acrylic acid or methacrylic acid and an alkyl ester thereof, an aryl ester thereof or an aralkyl ester thereof. Also, a copolymer of vinyl acetate or vinyl benzoate and crotonic acid is preferred. Among the phenol resins, particularly preferred is a novolac resin in which phenol, o-cresol, m-cresol or p-cresol and formaldehyde or acetaldehyde are condensed under acidic conditions.

Examples of the binder resin to be used in the present invention may be mentioned a copolymer of styrene, acrylate, methacrylate, vinyl acetate, vinyl benzoate, etc., and the above-mentioned carboxylic group-containing monomer such as a styrene/maleic acid monoalkyl ester copolymer, an acrylic acid/acrylate copolymer, a methacrylic acid/methacrylate copolymer, a styrene/methacrylic acid/methacrylate copolymer, an acrylic acid/methacrylate copolymer, an acrylic acid/methacrylate/acrylate copolymer, a methacrylic acid/methacrylate/acrylate copolymer, a styrene/methacrylic acid/acrylate copolymer, a styrene/acrylic acid/methacrylate copolymer, a vinyl acetate/crotonic acid copolymer, a vinyl acetate/crotonic acid/methacrylic acid copolymer, a vinyl benzoate/acrylic acid/methacrylate copolymer, etc. These binder resins may be used singly or in combination of two or more admixture.

Examples of the acid-soluble type binder resin may be mentioned triphenylmethane polymer and xanthone as disclosed in Japanese Patent Publication No. 41982/1989.

When the photoconductive layer is thin, necessary statically charge potential cannot be retained and high quality toner image cannot be obtained, while when it is too thick, not only deterioration of a dissolving solution is promoted during dissolution and removal of the photoconductive layer other than the toner image portion at the post-treatment but also thinning of the photoconductive layer becomes worse due to permeation of the dissolving solution to the photoconductive layer from the layer direction so that it is not preferred. Accordingly, the suitable thickness of the photoconductive layer according to the present invention is a minimum thickness or so at which the desired statically charged potential can be obtained stably in relation to development. In the present invention, the thickness of the photoconductive layer is preferably 0.5 to 10 $\mu$m, more preferably 1 to 7 $\mu$m.

In the photoconductive layer according to the present invention, a mixing ratio of the binder resin to be used with the photoconductive layer in combination may vary depending on the electrophotographic characteristics possessed by the photoconductive compound. However, the binder resin is so set as to the minimum thickness at which the statically charging property necessary for the toner developing treatment is ensured, and then, the mixing ratio with the photoconductive layer is determined so as to obtain desired sensitivity and residual potential.

In the photoconductive layer according to the present invention, an amount of the photoconductive compound is generally preferred in the range of 1 to 100% by weight, more suitably 5 to 40% by weight of the binder resin.

The material to be developed according to the present invention can be obtained by coating and laminating a coating solution for forming the photoconductive layer on the both surfaces of a support. The coating solution for forming the photoconductive layer is prepared by dissolving or dispersing components constituting the photoconductive layer in a suitable solvent. The concentration of the effective ingredients (the photoconductive compound and the binder resin, etc.) of the coating solution and the solvent to be used for coating may be selected suitable ones depending on the coating method and drying conditions, etc. Particularly when the photoconductive layer is prepared by the electrodeposition method, at least water is used as a solvent in combination. Also, in order to make the binder resin water-soluble, the binder resin may be used by neutralizing it with a basic compound-containing liquid. As the basic compound, there may be used, for example, an organic base such as triethylamine, diethylamine and monoethanolamine, etc., and an inorganic base such as sodium hydroxide, potassium hydroxide and aqueous ammonia, etc.

Also, when a solvent-insoluble component such as phthalocyanine, etc., is used as the photoconductive compound, it is preferred to use such a component by dispersing them with an average particle size of 0.4 $\mu$m or less, more preferably 0.2 $\mu$m or less by a dispersing machine. Moreover, to the coating solution, in addition to the photoconductive compound and the binder resin, a plasticizer, a surfactant and other additives may be added for the purpose of improving film properties of the photoconductive layer, viscosity of the coating solution and dispersibility, etc.

Lamination of the photoconductive layer according to the present invention to the metal conductive layer may be carried out, for example, a dipping method, a bar coating method, a spray coating method, a roll coating method, a curtain coating method and an electrodeposition method, etc. Other than the method wherein the photoconductive layers can be formed on the both surfaces simultaneously such as the dipping method, etc., the photoconductive layer may be formed by the different method on one surface from the other surface. Also, as a method for laminating the photoconductive layer, there have been known a method of adding the components constituting the photoconductive layer to the same layer, or a method of adding them to two or more layers separately, e.g., a method of using components in different layers separately by providing an easily dissolving and strongly adhesive binder resin at a lower layer (the metal conductive layer) and providing a resin with good statically charging property at an upper layer or increasing the amount of the photoconductive compound, etc., and either of the methods may be used for lamination. For drying the coating solution, the electrophotographic property is worsen particularly by the drying conditions (temperature and flow amount) of the initial drying zone so that mild drying conditions are preferably set.

Finally, preparation step of a printed wiring board after the toner developing treatment step according to the present invention is explained.

In the present invention, the material to be developed to which a toner image is provided to the photoconductive layer by the electrophotographic method uses the toner image portion as a resist and the photoconductive layer at an unnecessary portion (non-image portion) other than the above is removed by the dissolution treatment. For the dissolution treatment, an acidic dissolving solution containing an acidic compound is used when the binder resin of the photoconductive layer is an acid-soluble type material while an alkali dissolving solution containing an alkaline compound is used when it is an alkali-soluble type material.

As the acidic compound, there may be mentioned, for example, an acidic compound such as hydrochloric acid, sulfuric acid, phosphoric acid, formic acid, acetic acid and methanesulfonic acid, etc. In the acidic dissolving solution, these acidic compound may be used singly or in combination of two or more kinds.

As the alkali compound, there may be used, for example, an inorganic alkali compound such as a silicic acid alkali metal salt, an alkali metal hydroxide, phosphoric acid and alkali metal carbonate, and ammonium salt, etc., and an organic alkali compound such as an ethanolamine, ethylenediamine, propanediamine, triethylenetetramine, and morpholine, etc. In the alkali dissolving solutions, these alkali compounds may be used singly or in combination of two or more kinds.

Also, as the solvent of the dissolving solution, water can be advantageously used in either of the acidic solution or alkaline solution.

As the method and device for dissolving and removing the photoconductive layer at the non-image portion of the material to be developed, those conventionally known may be used. Particularly as the method and device for dissolving and removing the image-formed layer of a plate material having an image forming layer, etc. of the photosensitive layer or the photoconductive layer at the both surfaces, they are disclosed in Japanese Provisional Patent Publications No. 52352/1990, No. 52353/1990, No. 52354/1990, No. 52355/1990, No. 52356/1990, No. 93474/1990, No. 132447/1990, No. 275457/1990, No. 275461/1990, No. 29953/1991 and No. 48849/1991, etc., and they are preferably utilized.

The material to be developed from which the photoconductive layer at an unnecessary portion is dissolved and removed is then subjected to etching step to remove the exposed metal conductive layer. As the method of etching and an etching solution to be used for the treatment, etc., a method and an etching solution, etc. described in "Print Circuit Technique Handbook, Second Edition" (Edited by a Corporation of Print Circuit Association, published in 1993, published by Nikkan Kogyo Shinbunsha) may be used. However, as the etching solution, an etching resist comprising the toner image and the photoconductive layer has a resistance shall be used.

In general, when the binder resin used in the photoconductive layer is an acid-soluble type, an ammoniacal etching solution can be used. When it is an alkali-soluble type, a ferric chloride solution, a cupric chloride solution, and hydrogen peroxide-sulfuric acid solution, etc. may be used.

The resist image comprising the photoconductive layer and the toner image remained after the above-mentioned etching step is to be removed if it is not necessary when a circuit constituting part(s) is/are to be connected thereto. The resist image can be removed by the treatment using a solution having an acidity stronger than that of the dissolving solution when the acid-soluble binder resin is used, and using a solution having an alkalinity stronger than that of the dissolving solution when the alkali-soluble binder resin is used. Also, depending on the necessity, an organic solvent which is capable of dissolving the binder resin of the photoconductive layer, such as N,N-dimethylformamide, N,N-dimethylacetamide, dimethylsulfoxide, 2-butanone, 1,4-dioxane, 1,2-dimethoxyethane, methanol, ethanol, 2-propanol, 1-methoxy-2-propanol, 2-methoxyethanol and 2-butoxyethanol, etc., may be used.

According to the steps as mentioned above, a printed wiring board having wiring patterns corresponding to the toner images at the both surfaces of an insulating substrate can be obtained.

EXAMPLES

In the following, the present invention is explained in detail by referring to Examples, but the present invention is not limited by the following Examples.

Example 1

A both-surfaces copper-clad laminated board (available from Mitsubishi Gas Kagaku Co., CCL-E170, trade name) was used as a substrate and a standard hole with a diameter of 5 mm was made at the corners of the diagonal lines of a rectangular shaped substrate with 340 mm×510 mm (0.8 mm in thickness). The longer edges (a side portion of 510 mm) of the board were sandwiched by a chuck with a size of 10 mm and the board was dipped in a dipping tank in which a coating solution for forming an electrophotographic photoconductive layer (which comprises 50 parts by weight of a methacrylic acid/benzyl methacrylate/n-butyl acrylate copolymer (weight compositional ratio 20/30/50, molecular weight 25,000), 10 parts by weight of $\chi$ type non-metal phthalocyanine (available from Dainichi Seika Kogyo, MCP-80, trade name) and 690 parts by weight of 1,4-dioxane), and a photoconductive layer with a thickness of about 5 $\mu$m was provided by the dipping method to prepare a material to be developed.

For carrying out electrical connection at the copper clad portion of the both surfaces, a conductive tape (available from 3M, No. 1245) with a size of 5 mm×5 mm was adhered to the exposed copper portion sandwiched by the chuck.

This material to be developed in which the photoconductive layers are formed on the both surfaces was placed on a platen of a laser exposure machine, and two standard holes at the corners of the diagonal lines of the rectangular substrate were monitored by using an emission element and CCD and the material to be developed was moved to the XY directions by the action of a pressure pin which presses the side surface portion to effect registering.

Moreover, 1000 V of voltage was applied between statically charging rolls provided to the platen and the platen, and statically charging was carried out by moving the platen while pressing the rolls to the material to be developed, and then, the photoconductive layer of the material to be developed was exposed by scanning semiconductor laser light (a beam diameter on the platen of 40 $\mu$m) at 780 nm and an output of 20 mW with an octahedral polygon to obtain an electrostatic latent image of a wiring pattern.

Then, the material to be developed was reversed, and registering was carried out by referring to the standard holes measured by using a CCD camera again.

Then, 1000 V of voltage was again applied between statically charging rolls provided to the platen and the platen, and statically charging was carried out by moving the platen while pressing the rolls to the material to be developed, and then, the photoconductive layer of the material to be developed was exposed by scanning semiconductor laser light (a beam diameter on the platen of 40 $\mu$m) at 780 nm and an output of 20 mW with an octahedral polygon to obtain an electrostatic latent image of a wiring pattern.

Next, the material to be developed in which electrostatic latent images were formed on the both surfaces as mentioned above was subjected to toner developing treatment by using a liquid developing device as disclosed in Example of Japanese Provisional Patent Publication No. 137276/1996.

To the material to be developed which had been subjected to toner developing treatment was sprayed a 2% by weight of sodium carbonate solution heated to 35° C., and then, washed with tap water to dissolve and remove the photoconductive layer at the portion which had not been covered by the toner. Then, an aqueous ferric chloride solution heated to 45° C. was sprayed thereto to remove the exposed copper portion. Moreover, 5% by weight of an aqueous sodium hydroxide solution heated to 30° C. was sprayed to remove the remaining toner and the photoconductive layer to obtain wiring patterns on the both surfaces of the material to be developed.

The wiring pattern-formed surfaces of the resulting material to be developed had no stain on the both surfaces and good images with uniform wiring width had been formed.

Example 2

By using the material to be developed prepared in the same manner as in Example 1 and using a light emitting diode array as the exposing means, formation of toner image was carried out. That is, one surface (which is called a surface A) of the material to be developed was firstly placed on the platen by making it an upper surface (exposing surface), positions of a standard mark provided on the exposing machine platen and a standard hole of the material to be developed were simultaneously measured, i.e., subjected to image treatment, by a CCD camera and values to be corrected of the respective two points were obtained with the positions X, Y and an angle from the center coordinate axis. Alignment of the material to be developed was carried out by correcting the standard positions of the platen and the exposure heads of the light emitting diode array according to the values to be corrected.

Thereafter, at the state of closely contacting the substrate on the platen by vacuum suction, statically charging of the material to be developed on the platen was carried out by moving the platen under the corotron statically charging machine attached to the exposing machine. The surface potential was uniformly about +250 V. At this time, electrical grounding of the metal conductive layer of the material to be developed was carried out by contacting a metallic member at the both sides of the side surfaces of the material to be developed. Thereafter, exposure at the wiring pattern portion was carried out by the light emitting diode array-exposing machine to form an electrostatic latent image corresponding to the wiring pattern.

Thereafter, toner-developing treatment was carried out by using the same toner developing treatment device used in Example 1. Next, the resulting material to be developed was placed again on the platen of the light emitting diode array exposing machine by making the surface of the opposite side (which is called a surface B) as an upper surface (exposing surface) in this time using a reversing means. In the same manner as in the case of the surface A, alignment, statically charging and exposure were carried out with respect to the surface B on the platen to form an electrostatic latent image corresponding to the wiring pattern of the surface B. Thereafter, in the same manner as in the case of the surface A, toner developing treatment of the surface B was carried out to prepare a material to be developed on the both surfaces of which toner images had been formed.

Removal of Photoconductive Layer at Non-image Portion

Next, by using a 1% concentration of an aqueous sodium carbonate solution, the photoconductive layer at the portion other than the toner image portion was dissolved and removed, whereby a wiring pattern image comprising image portions of the toner image and the undissolved photoconductive layer under the toner image was formed.

Preparation of Metal Wiring Pattern

The wiring pattern image comprising the above-mentioned toner image and the undissolved photoconductive layer under the toner image was used as an etching resist and a ferric chloride etching solution with Baumé degree of 42° and heated to 40° C. was sprayed to the material to be developed at a spraying pressure of 2.5 kg/cm$^2$ for one minutes to remove the exposed copper layer. Thereafter, the resist image was removed by methyl ethyl ketone to form a copper-wiring pattern.

In the resulting copper wiring pattern, no defect of wiring at any portion and no increase in a line width were observed.

Example 3

Preparation of Photoconductive Layer

A both-surfaces copper-clad laminated board (available from Mitsubishi Gas Kagaku Co., CCL-E170, trade name) was used as a substrate and a rectangular shaped substrate with 340 mm×510 mm (0.8 mm in thickness) were made through holes of 0.3 mm$\phi$ and 0.5 mm$\phi$ at the predetermined positions according to the wiring pattern, and a copper layer with a thickness of 8 $\mu$m was formed on the inside surface of the through holes and the surface of the laminated board according to electroless copper plating (manufactured by Okuno Seiyaku K.K., OPC process M) and electrolysis copper plating (copper sulfate plating). The laminated board to which the above-mentioned copper plating had been applied was dipped in a coating solution containing 5 parts by weight of $\chi$ type non-metal phthalocyanine (available from Dainippon Ink K.K., Fastogen blue #8120, trade name), 25 parts by weight of a methacrylic acid/methyl methacrylate/n-butyl acrylate copolymer (weight ratio 20/40/40, molecular weight 20,000) and 270 parts by weight of propyl acetate, and a photoconductive layer was formed at the surface of the laminated board and the inside surface of the through holes. The resulting photoconductive layer had good adhesiveness to the copper layer and had a thickness of 5 $\mu$m. Electrophotographic characteristics of the photoconductive layer were evaluated by an electrostatic field measuring device SP-428 (trade name) manufactured by K.K. Kawaguchi Denki Seisakusho. When a corona voltage of +5.3 kV was applied to the layer, $V_0$ (surface potential immediately after corona charging, an initial potential) was +300 V and $DD_{10}$ (a potential retaining ratio after 10 seconds from charging) was 92%. Also, when white (tungsten) light with 2 lux was irradiated thereto after 10 seconds from charging, sensitivity $E_{1/2}$ (an exposure dose necessary for making the surface potential a half of $V_0$) was 3.1 lux·sec so that it could be confirmed that the material had good statically charging properties and photoconductivity.

Formation of Toner Image

The resulting material to be developed having the photoconductive layer was conveyed while sandwiching with rolls and statically charging of the both surfaces of the material to be developed were carried out by a corona discharging means to which corotrons were attached to the up and down both sides of the conveying surfaces. The surface potential was uniformly about +250 V.

Thereafter, the material to be developed was placed on the platen of an exposing machine having a light emitting diode array so that one surface (which is called a surface A) thereof became an upper surface (exposing surface), and alignment was carried out by detecting the position of the standard holes of the material to be developed by moving the material to be developed to the platen while measuring the surface potential of the material to be developed by a probe of the surface potential meter provided at the standard position of the platen. At this time, dried air was blown from spout openings provided onto the platen whereby movement of the material to be developed is carried out by slightly floating the material to be developed from the platen. According to this operation, alignment was carried out without causing defects due to contact of the material to be developed with the platen. Then, after confirming the alignment again by being no change in the surface potential at the state that the material to be developed is closely contacted with the platen by vacuum suction, and exposure of the wiring patter portion of the surface A was carried out by a light emitting diode array to form an electrostatic latent image on the surface A.

Thereafter, toner developing treatment was carried out by using a positive charge toner (available from Mitsubishi Paper Mills Limited, "ODP-TW", trade name) as a liquid developer by a toner developing treatment device having a toner developing portion as shown in FIG. 3. By making the surface A upper surface, the material to be developed was conveyed with 2 m/min and +180 V of a bias voltage Va was applied to the upper side developing electrode 12a. The lower side developing electrode 12b was shorted to the copper layer of the material to be developed as a ground and a bias voltage Vb was made 0 V. The liquid developer was supplied from a toner supplying opening 13 at the up and down both sides of the developing electrode to the up and down both surfaces of the material to be developed to adhere the toner particles to the wiring pattern image portion of the surface A of the material to be developed and the inner surface portion of the through holes. Excessive liquid developer was removed by a pair of squeezing rolls 14, and then, drying and thermal fixing were carried out to form a toner image on the surface A and inner surface of the through holes.

Next, the resulting material to be developed was placed on the platen by making the surface of the opposite side (which is called a surface B) an upper surface (exposing surface) using a reversing means, and after subjecting to both surfaces statically charging by the both surfaces corona discharging in the same manner as in that of the surface A, the material to be developed was placed on the platen by making the surface B the upper surface. In the same manner as in the case of the surface A, alignment, statically charging and exposure on the platen were carried out with respect to the surface B to form an electrostatic latent image corresponding to the wiring pattern of the surface B. Thereafter, in the same manner as in the case of the surface A, toner developing treatment of the surface B was carried out except for subjecting to the toner developing treatment by making the surface B having an electrostatic latent image the upper surface to prepare a material to be developed on the both surfaces and at the through hole portion of which toner images had been formed.

When the inner portions of the through holes were observed by a microscope, attachment of the toner on the whole surface at the inner portions of the 0.3 mmφ through hole and the 0.5 mmφ through hole was confirmed and no defect was observed.

Removal of Photoconductive Layer at Non-image Portion

Next, by using a 1% concentration of an aqueous sodium carbonate solution, the photoconductive layer at the portion other than the toner image portion was dissolved and removed, whereby a wiring pattern image comprising image portions of the toner image and the undissolved photoconductive layer under the toner image was formed.

Preparation of Metal Wiring Pattern

The wiring pattern image comprising the above-mentioned toner image and the undissolved photoconductive layer under the toner image was used as an etching resist and a ferric chloride etching solution with Baumé degree of 42° and heated to 40° C. was sprayed to the material to be developed at a spraying pressure of 2.5 kg/cm² for one minutes to remove the exposed copper layer. Thereafter, the resist image was removed by methyl ethyl ketone to form a copper-wiring pattern.

In the resulting copper wiring pattern, no defect of wiring at any portion and no increase in a line width were observed. Also, with regard to open circuit, no open circuit was observed in the 0.3 mmφ through hole and the 0.5 mmφ through hole.

For testing the durability, the following heat cycle test as mentioned below was carried out. That is, while measuring open circuit resistance at the wiring portion containing through holes, the material was experienced alternately between a hot oil at 260° C. and room temperature, and thermal shock was provided thereto. A number of the cycles until when increase in the through hole plating resistance value or causing open circuit was measured by 100 cycles as the maximum. As a result, both of the 0.3 mmφ through hole and the 0.5 mmφ through hole, good open circuit of the through holes after completion of 100 cycles was maintained without increase in the resistance value.

Example 4

By using the material to be developed prepared in the same manner as in Example 3 and using the same devices as in Example 3, both surfaces statically charging, alignment and exposure of the surface A were carried out, and then, the material was reversed and subjected to alignment and exposure of the surface B.

Thereafter, toner developing treatment was carried out by using a positive charge toner (available from Mitsubishi Paper Mills Limited, "ODP-TW", trade name) as a liquid developer with a toner developing treatment device having each two developing electrodes at the upper side and the bottom side as shown in FIG. 4. Each of the first developing electrodes 12a and 12b at the upper side and the bottom side was made an earth electrode and made the same potential (Va=Vb=0 V) as that of the copper layer of the substrate. Also, to the second developing electrodes (12c: the second developing electrode at the upper side, 12d: the second developing electrode at the bottom side) were applied 180 V of bias voltages (Vc=Vd=180 V). The material was conveyed with a conveying rate of 2 m/min, attachment of toner particles to the substrate wiring pattern portion and the inner portion of the through holes were carried out at the developing electrode portion, excessive liquid developer was squeezed by a pair of squeezing rolls 14 and removed, and through drying and thermal fixing, toner images were formed at the both surfaces of the substrate and the through hole portions.

When the inner portions of the through holes were observed by a microscope, attachment of the toner on the whole surface at the inner portions of the 0.3 mmφ through hole and the 0.5 mmφ through hole was confirmed and no defect was observed.

Thereafter, in the same manner as in Example 3, removal of the photoconductive layer at the non-image portion and preparation of a metal wiring pattern were carried out to form a copper wiring pattern.

In the resulting copper wiring pattern, no defect of wiring at any portion and no increase in a line width were observed. Also, with regard to open circuit, no open circuit was observed in the 0.3 mmφ through hole and the 0.5 mmφ through hole. When the inner portions of the through holes were observed by a microscope, attachment of the toner on the whole surface at the inner portions of the 0.3 mmϕ through hole and the 0.5 mmϕ through hole was confirmed and no defect was observed.

For testing the durability, the heat cycle test in the same manner as carried out in Example 3 was carried out. As a result, both of the 0.3 mmϕ through hole and the 0.5 mmϕ through hole, good open circuit of the through holes after completion of 100 cycles was maintained without increase in the resistance value.

Preparation of Metal Wiring Pattern

The wiring pattern image comprising the above-mentioned toner image and the undissolved photoconductive layer under the toner image was used as an etching resist and a ferric chloride etching solution with Baumé degree of 42° and heated to 40 ° C. was sprayed to the material to be developed at a spraying pressure of 2.5 kg/cm² for one minutes to remove the exposed copper layer. Thereafter, the resist image was removed by methyl ethyl ketone to form a copper wiring pattern.

In the resulting copper wiring pattern, no defect of wiring at any portion and no increase in a line width were observed. Also, with regard to open circuit, no open circuit was observed in the 0.3 mmϕ through hole and the 0.5 mmϕ through hole.

For testing the durability, the following heat cycle test as mentioned below was carried out. That is, while measuring open circuit resistance at the wiring portion containing through holes, the material was experienced alternately between a hot oil at 260° C. and room temperature, and thermal shock was provided thereto. A number of the cycles until when increase in the through hole plating resistance value or causing open circuit was measured by 100 cycles as the maximum. As a result, both of the 0.3 mmϕ through hole and the 0.5 mmϕ through hole, good open circuit of the through holes after completion of 100 cycles was maintained without increase in the resistance value.

Example 5

In the same manner as in Example 3, a material to be developed was prepared and statically charging was carried out to the both surfaces of about 250 V according to the both surfaces roll statically charging method. Thereafter, the material to be developed was placed and retained on the platen (a substrate folder) of a photomask exposing portion which retains only by the peripheral portion, and after subjecting to alignment by closely contacting photomasks which correspond to the wiring pattern of the both surfaces of the surface A and the surface B by closely contacting therewith from both surfaces, surface exposures were carried out to form electrostatic latent images on the both surfaces of the surface A and the surface B. Alignment was carried out by using a CCD camera, and positional shears X, Y and θ of the standard mark of the photomask and the standard holes of the material to be developed were read by the CCD camera, and slightly moving the photomask to the X, Y and θ directions based on these values.

Thereafter, toner developing treatment was carried out by the same conditions as in Example 4 to form toner images.

When the inner portions of the through holes were observed by a microscope, attachment of the toner on the whole surface at the inner portions of the 0.3 mmϕ through hole and the 0.5 mmϕ through hole was confirmed and no defect was observed.

Thereafter, in the same manner as in Example 3, removal of the photoconductive layer at the non-image portion and preparation of a metal wiring pattern were carried out to form a copper wiring pattern.

In the resulting copper wiring pattern, no defect of wiring at any portion and no increase in a line width were observed. Also, with regard to open circuit at the through hole portion, no open circuit was observed in both of the 0.3 mmϕ through hole and the 0.5 mmϕ through hole. When the inner portions of the through holes were observed by a microscope, attachment of the toner on the whole surface at the inner portions of the 0.3 mmϕ through hole and the 0.5 mmϕ through hole was confirmed and no defect was observed.

For testing the durability, the heat cycle test in the same manner as carried out in Example 3 was carried out. As a result, both of the 0.3 mmϕ through hole and the 0.5 mmϕ through hole, good open circuit of the through holes after completion of 100 cycles was maintained without increase in the resistance value.

Utilizability in Industry

According to the preparation method of a printed wiring board and the preparation device of the present invention, for preparing a printed wiring board having circuits on the both surfaces of the substrate by utilizing the electrophotographic method, a printed wiring board in which the positional relationship of electrostatic latent images themselves and statically charging potentials. necessary for the positions can be ensured, uniform and good image can be formed with high quality can be obtained from a material to be developed having at least a metal conductive layer and a photoconductive layer on the both surfaces of an insulating substrate in this order.

Also, with regard to a through hole(s), toner is completely attached to the inner portion of the through hole(s) without impairing dissolution of wiring images at the both surfaces of the substrate whereby good resist can be formed, so that a high quality printed wiring board having a through hole(s) which has durability and stable without causing open circuit can be obtained.

What is claimed is:

1. A method for preparing a printed wiring board which comprises:

preparing a material to be developed by making a through hole(s) to a laminated board in which first metal conductive layers are provided on both surfaces of an insulating substrate, subjecting the laminated board to metal plating treatment to provide second metal conductive layers at the inside of the through hole(s) and on the surface of the laminated board, and forming photoconductive layers on the second metal conductive layers, placing the material to be developed having at least a metal conductive layer and a photoconductive layer on both surfaces of an insulating substrate in this order on a platen to apply thereto alignment and static charge, wherein alignment of the statically charged material to be developed is carried out by measuring surface potentials of the through hole and near to the through hole, then exposing one of the photoconductive layer of the material to be developed to provide an electrostatic latent image, reversing the material to be developed to apply thereto alignment and static charge again, exposing the photoconductive layer surface which is the opposite surface of the electrostatic latent image-formed surface of the material to be developed to form an electrostatic latent image, and subjecting to toner developing treatment.

2. A method for preparing a printed wiring board which comprises:

preparing a material to be developed by making a through hole(s) to a laminated board in which first metal conductive layers are provided on both surfaces of an insulating substrate, subjecting the laminated board to metal plating treatment to provide second metal conductive layers at the inside of the through hole(s) and on the surface of the laminated board, and forming photoconductive layers on the second metal conductive layers, statically charging photoconductive layers at both surfaces of the material to be developed having at least a metal conductive layer and a photoconductive layer on both surfaces of an insulating substrate in this order, subjecting to alignment to a predetermined position, wherein alignment of the statically charged material to be developed is carried out by measuring surface potentials of the through hole and near to the through hole, exposing the material to provide an electrostatic latent image on one photoconductive layer surface of the material to be developed, reversing the material to be developed to apply thereto alignment to a predetermined position, exposing the photoconductive layer surface which is the opposite surface of the electrostatic latent image-formed surface of the material to be developed to form an electrostatic latent image, and subjecting to toner developing treatment.

3. A method for preparing a printed wiring board which comprises:

preparing a material to be developed by making a through hole(s) to a laminated board in which first metal conductive layers are provided on both surfaces of an insulating substrate, subjecting the laminated board to metal plating treatment to provide second metal conductive layers at the inside of the through hole(s) and on the surface of the laminated board, and forming photoconductive layers on the second metal conductive layers, statically charging photoconductive layers at both surfaces of a material to be developed having at least a metal conductive layer and a photoconductive layer on both surfaces of an insulating substrate in this order, providing development electrodes which can apply voltages between said metal conductive layers on both surfaces of the insulating substrate which are opposed to the metal conductive layers on both sides of the substrate, and toner developing treatment of the material to be developed is carried out by setting a bias voltage of said development electrode opposed to the surface of the photoconductive layer on which no electrostatic latent image is formed to 0 V, exposing the material to provide an electrostatic latent image on one photoconductive layer surface of the material to be developed, subjecting to toner developing treatment to form a toner image, statically charging again both surfaces of the material to be developed, exposing the photoconductive layer surface which is the opposite surface of the toner image-formed surface of the material to be developed to form an electrostatic latent image, and subjecting to toner developing treatment.

4. A method for preparing a printed wiring board which comprises:

preparing a material to be developed by making a through hole(s) to a laminated board in which first metal conductive layers are provided on both surfaces of an insulating substrate, subjecting the laminated board to metal plating treatment to provide second metal conductive layers at the inside of the through hole(s) and on the surface of the laminated board, and forming photoconductive layers on the second metal conductive layers, statically charging photoconductive layers at both surfaces of a material to be developed having at least a metal conductive layer and a photoconductive layer on both surfaces of the insulating substrate in this order, exposing the material to provide electrostatic latent images on the photoconductive layer surfaces at both surfaces of the material to be developed, and subjecting to toner developing treatment by development electrodes which are so provided to be opposed to the respective photoconductive layers, which electrodes can apply at least two different bias voltages to the respective surfaces of the material to form a toner image.

5. The preparation method of a printed wiring board according to any one of claims 1 to 4, wherein an exposure method comprises a scanning exposure system using a light emitting diode array.

6. The preparation method of a printed wiring board according to claim 3 or claim 4, wherein alignment of the statically charged material to be developed is carried out by measuring surface potentials of the through hole and near to the same.

7. A preparation device of a printed wiring board which comprises a platen on which a material to be developed having a metal conductive layer and a photoconductive layer on at least one surface of an insulating substrate in this order is to be placed thereon, a supplying means of the material to be developed for placing the material to be developed on the platen, a statically charging means for statically charging at least the surface at which the photoconductive layer is provided of the material to be developed, a registration means for subjecting the material to be developed on the platen to alignment at a predetermined position, wherein alignment of the statically charged material to be developed is carried out by measuring a surface potential of the statically charged surface, an exposure means for forming an electrostatic latent image on the statically charged photoconductive layer surface, and a means for reversing the material to be developed which is capable of reversing the material to be developed at least one surface of which is formed a static charge latent image.

8. The preparation device of a printed wiring board according to claim 7, wherein the above-mentioned statically charging means is a roll statically charging means.

9. The preparation device of a printed wiring board according to claim 7, wherein the device has a surface potential measuring means which measures a surface potential of the statically charged material to be developed.

10. A preparation device of the printed wiring board which comprises a platen on which a material to be developed having at least a metal conductive layer and a photoconductive layer on both surfaces of an insulating substrate in this order is to be placed thereon, a supplying means of the material to be developed for placing the material to be developed on the platen, a statically charging means for statically charging the photoconductive layers on both surfaces of the material to be developed, a registration means for subjecting the material to be developed on the platen to alignment at a predetermined position, wherein alignment of the statically charged material to be developed is carried out by measuring a surface potential of the statically charged surface, an exposure means for forming an electrostatic latent image on the statically charged photoconductive layer surface, and a reversing means of the material to be developed which is capable of reversing the material to be developed at least one surface of which is formed a static charge latent image.

11. The preparation device of a printed wiring board according to claim 7 or claim 10, wherein the device has a grounding means which contacts with a side surface of the material to be developed placed on the platen.

12. A method for preparing a printed wiring board which comprises:

preparing a material to be developed by making a through hole(s) to a laminated board in which first metal conductive layers are provided on both surfaces of an insulating substrate, subjecting the laminated board to metal plating treatment to provide second metal conductive layers at the inside of the through hole(s) and on the surface of the laminated board, and forming photoconductive layers on the second metal conductive layers, statically charging photoconductive layers at both surfaces of a material to be developed having at least a metal conductive layer and a photoconductive layer on both surfaces of an insulating substrate in this order, aligning the statically charged layers of the material to be developed to a predetermined position by measuring surface potentials of the through hole and near to the through hole, exposing the material to provide an electrostatic latent image on one photoconductive layer surface of the material to be developed, subjecting to toner developing treatment to form a toner image, statically charging again both surfaces of the material to be developed, exposing the photoconductive layer surface which is the opposite surface of the toner image-formed surface of the material to be developed to form an electrostatic latent image, and subjecting to toner developing treatment.

13. A method for preparing a printed wiring board which comprises:

preparing a material to be developed by making a through hole(s) to a laminated board in which first metal conductive layers are provided on both surfaces of an insulating substrate, subjecting the laminated board to metal plating treatment to provide second metal conductive layers at the inside of the through hole(s) and on the surface of the laminated board, and forming photoconductive layers on the second metal conductive layers, statically charging photoconductive layers at both surfaces of a material to be developed having at least a metal conductive layer and a photoconductive layer on both surfaces of an insulating substrate in this order, aligning the statically charged layers of the material to be developed to a predetermined position by measuring surface potentials of the through hole and near to the through hole, exposing the material to provide electrostatic latent images on the photoconductive layer surfaces at both surfaces of the material to be developed, and subjecting to toner developing treatment by development electrodes which are so provided to be opposed to the respective photoconductive layers, which electrodes can apply at least two different bias voltages to the respective surfaces of the material to form a toner image.

* * * * *